United States Patent
Yang

(10) Patent No.: US 12,432,939 B2
(45) Date of Patent: Sep. 30, 2025

(54) SEMICONDUCTOR MEMORY DEVICES

(71) Applicant: Samsung Electronics Co., Ltd., Suwon-si (KR)

(72) Inventor: Seryeun Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 312 days.

(21) Appl. No.: 17/839,612

(22) Filed: Jun. 14, 2022

(65) Prior Publication Data

US 2023/0157036 A1    May 18, 2023

(30) Foreign Application Priority Data

Nov. 12, 2021 (KR) .................. KR10-2021-0155887

(51) Int. Cl.
*H10B 99/00* (2023.01)
*H01L 23/532* (2006.01)

(52) U.S. Cl.
CPC ......... *H10B 99/00* (2023.02); *H01L 23/5329* (2013.01)

(58) Field of Classification Search
CPC ......... H01L 23/5329–53295; H10B 99/00–22; H10B 12/00–50; H10B 20/00–65; H10B 41/00–70; H10B 43/00–50; H10B 51/00–50; H10B 53/00–50; H10B 61/00–22; H10B 63/10–845; H10B 69/00; H10B 80/00

See application file for complete search history.

(56) References Cited

U.S. PATENT DOCUMENTS

| | | | |
|---|---|---|---|
| 7,138,675 B2 | 11/2006 | Lee et al. |
| 7,476,584 B2 | 1/2009 | Park |
| 8,623,727 B2 | 1/2014 | Shin et al. |
| 9,177,891 B2 | 11/2015 | Kim et al. |
| 10,103,030 B2 | 10/2018 | Min et al. |
| 10,297,495 B2 | 5/2019 | Lee et al. |
| 10,522,362 B2 | 12/2019 | Kim et al. |
| 10,879,248 B2 | 12/2020 | Choi et al. |
| 11,114,445 B2 | 9/2021 | Choi et al. |

(Continued)

FOREIGN PATENT DOCUMENTS

| KR | 10-2019-0063092 A | 6/2019 |
|---|---|---|
| KR | 10-2020-0143605 A | 12/2020 |

*Primary Examiner* — Amar Movva
(74) *Attorney, Agent, or Firm* — Wolf, Greenfield & Sacks, P.C.

(57) ABSTRACT

A semiconductor memory device may include a substrate including an active pattern, the active pattern including first and second source/drain regions spaced apart from each other, a bit line that is electrically connected to the first source/drain region and crosses the active pattern, a storage node contact electrically connected to the second source/drain region, a spacer structure between the bit line and the storage node contact, a landing pad electrically connected to the storage node contact, an insulating pattern on the spacer structure and adjacent to the landing pad, and a liner between the insulating pattern and the landing pad. The insulating pattern may include an upper insulating portion and a lower insulating portion between the upper insulating portion and the spacer structure. The largest width of the lower insulating portion may be larger than the smallest width of the upper insulating portion.

20 Claims, 29 Drawing Sheets

(56) References Cited

U.S. PATENT DOCUMENTS

| | | |
|---|---|---|
| 2007/0037345 A1 | 2/2007 | Manger |
| 2017/0278847 A1 | 9/2017 | Kim et al. |
| 2019/0164975 A1* | 5/2019 | Song .................... H10B 12/315 |
| 2020/0395244 A1* | 12/2020 | Lee ..................... H01L 21/7682 |
| 2021/0066304 A1 | 3/2021 | Kang et al. |

* cited by examiner

SEMICONDUCTOR MEMORY DEVICES

CROSS-REFERENCE TO RELATED APPLICATION(S)

This U.S. non-provisional patent application claims priority under 35 U.S.C. § 119 to Korean Patent Application No. 10-2021-0155887, filed on Nov. 12, 2021, in the Korean Intellectual Property Office, the entire contents of which are hereby incorporated by reference.

BACKGROUND

The present disclosure relates to a semiconductor memory devices. Due to their small-sized, multifunctional, and/or low-cost characteristics, semiconductor devices are being esteemed as important elements in the electronics industry. A memory device, which is one example of a semiconductor device, is configured to store logical data. As the electronics industry advances, there is an increasing demand for semiconductor devices with improved characteristics. For example, there is an increasing demand for semiconductor devices with high reliability, high performance, and/or multiple functions. To meet this demand, structural complexity and/or integration density of semiconductor devices may be increased.

SUMMARY

An embodiment of the inventive concept provides a semiconductor memory device with improved electrical characteristics.

According to an embodiment of the inventive concept, a semiconductor memory device may include a substrate including an active pattern including a first source/drain region and a second source/drain region that are spaced apart from each other, a bit line that is electrically connected to the first source/drain region and crosses the active pattern, a storage node contact electrically connected to the second source/drain region, a spacer structure between the bit line and the storage node contact, a landing pad electrically connected to the storage node contact, an insulating pattern on the spacer structure and adjacent to the landing pad, and a liner between the insulating pattern and the landing pad. The insulating pattern may include an upper insulating portion and a lower insulating portion between the upper insulating portion and the spacer structure. The largest width of the lower insulating portion may be larger than the smallest width of the upper insulating portion.

According to an embodiment of the inventive concept, a semiconductor memory device may include a substrate including an active pattern, a bit line crossing the active pattern, a storage node contact adjacent to the bit line, a spacer structure that is between the bit line and the storage node contact, a first trench and a second trench on the spacer structure, the second trench being between the first trench and the spacer structure, a landing pad electrically connected to the storage node contact, an insulating pattern in the first trench and the second trench, a liner enclosing the insulating pattern. The liner may include an upper liner in the first trench and a lower liner in the second trench. The largest thickness of the upper liner may be larger than the largest thickness of the lower liner.

According to an embodiment of the inventive concept, a semiconductor memory device may include a substrate including an active pattern including a first source/drain region and a pair of second source/drain regions, where the second source/drain regions are spaced apart from each other and have the first source/drain region therebetween, a device isolation layer on the substrate in a trench defining the active pattern, a word line extending in a first direction across the active pattern, a gate dielectric layer between the word line and the active pattern, a word line capping pattern on the word line, an interlayer insulating pattern on the word line capping pattern, a bit line that is electrically connected to the first source/drain region, is on the interlayer insulating pattern, and extends in a second direction crossing the first direction, the bit line including a bit line polysilicon pattern, a bit line diffusion prevention pattern, and a bit line metal pattern that are sequentially stacked, a spacer structure on a side surface of the bit line, a storage node contact that is coupled to one of the second source/drain regions and is spaced apart from the bit line by the spacer structure, a landing pad electrically connected to the storage node contact, an insulating pattern on the spacer structure and adjacent to the landing pad, a liner between the insulating pattern and the landing pad, and a data storage pattern on the landing pad. The insulating pattern may include an upper insulating portion and a lower insulating portion between the upper insulating portion and the spacer structure. The largest width of the lower insulating portion may be larger than the smallest width of the upper insulating portion.

DETAILED DESCRIPTION

Figure 1:
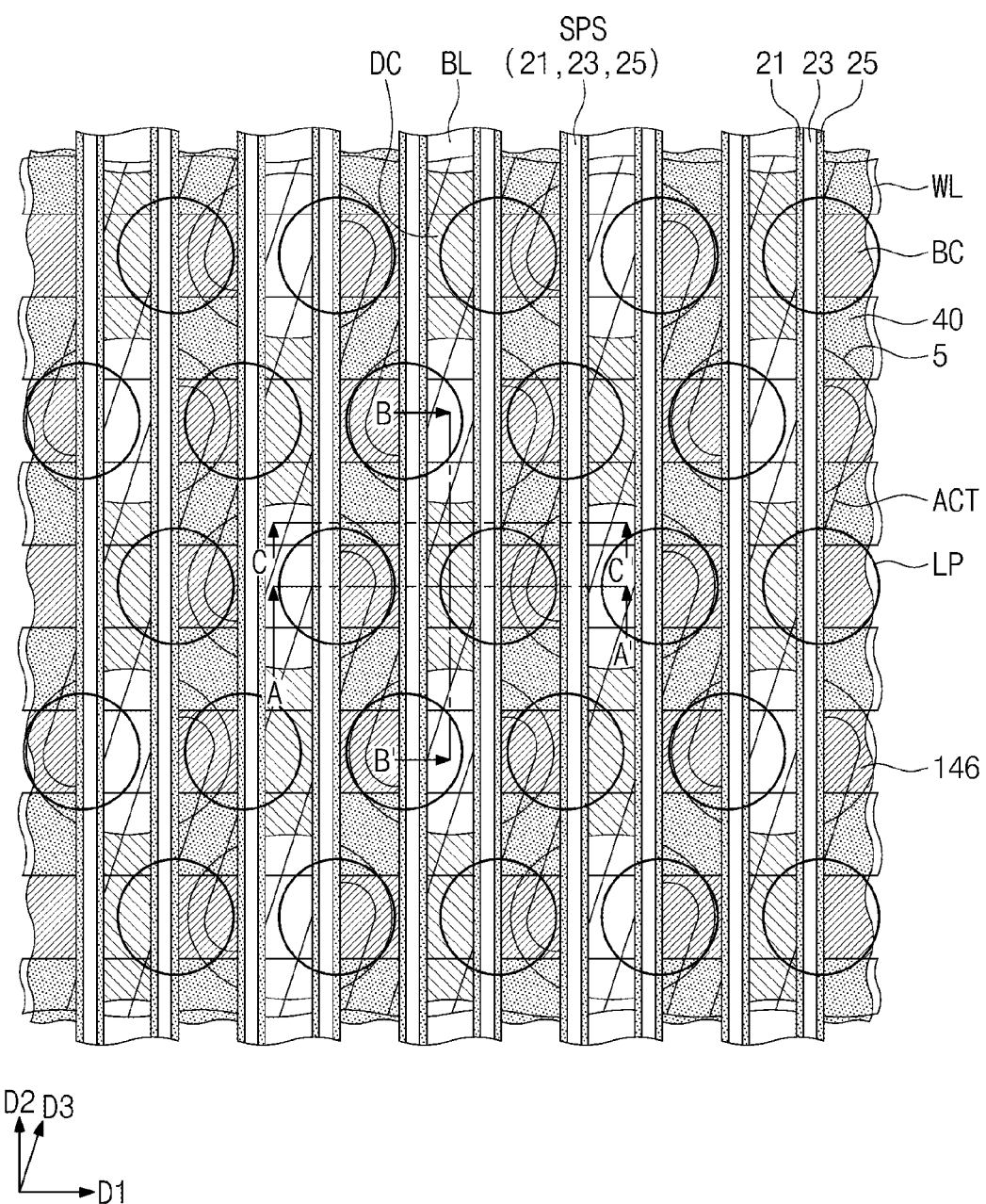
FIG. 1 is a plan view illustrating a semiconductor memory device according to an embodiment of the inventive concept.
Figure 2:
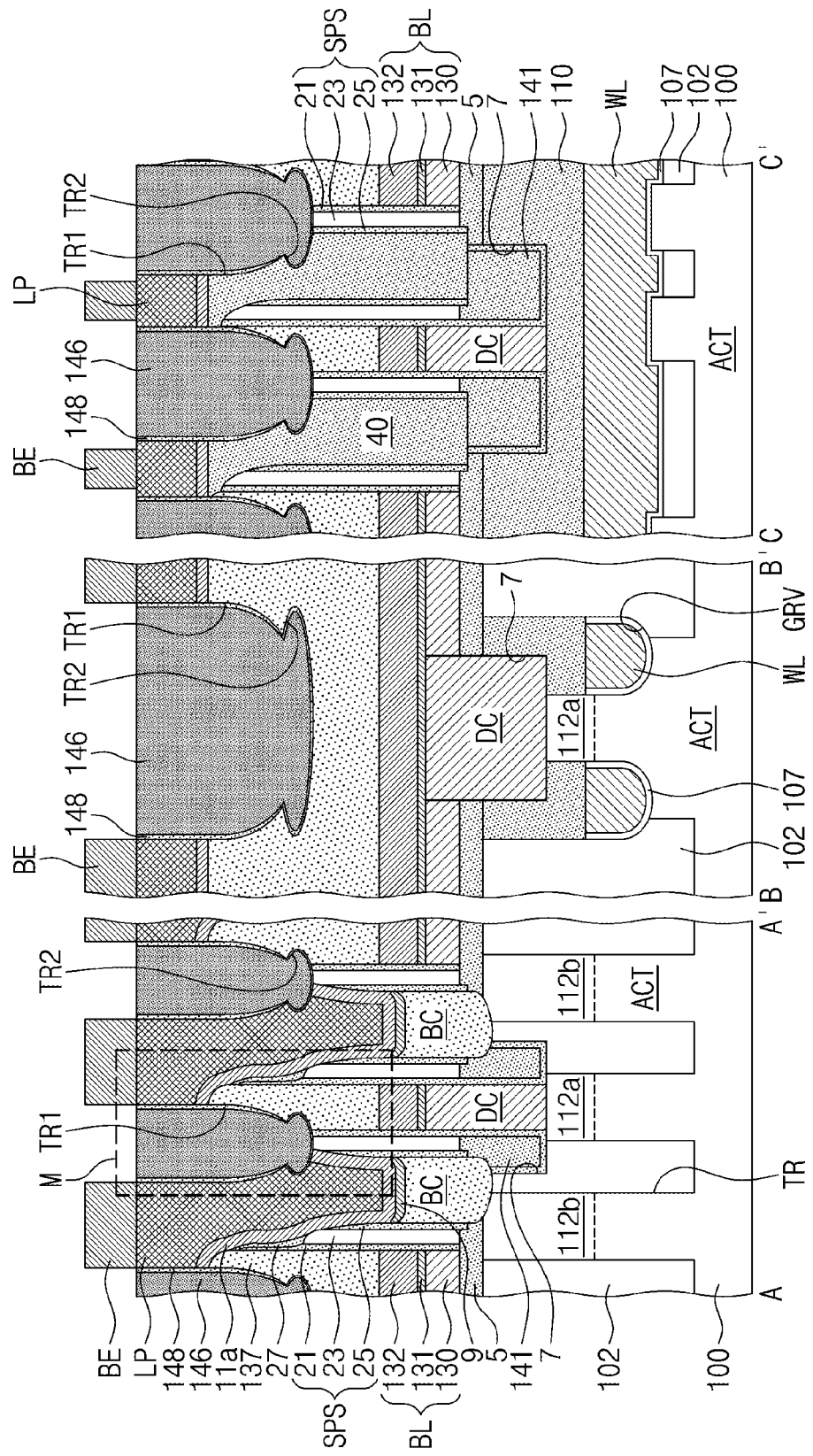
FIG. 2 is a sectional view illustrating sections taken along lines A-A', B-B', and C-C' of FIG. 1.
Figure 3:
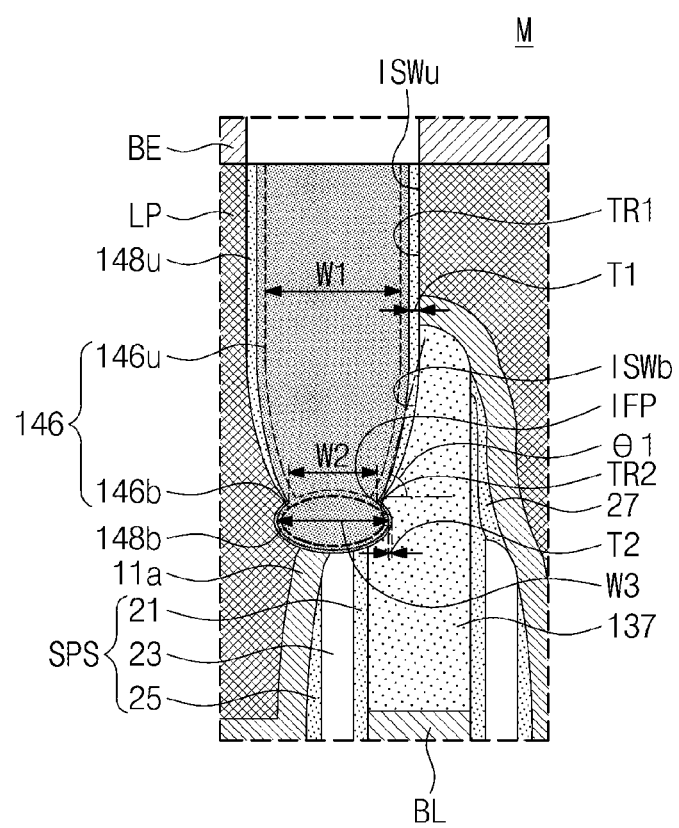
FIG. 3 is an enlarged sectional view illustrating a portion 'M' of FIG. 2.

FIG. 1 is a plan view illustrating a semiconductor memory device according to an embodiment of the inventive concept. FIG. 2 is a sectional view illustrating sections taken along lines A-A', B-B', and C-C' of FIG. 1. FIG. 3 is an enlarged sectional view illustrating a portion 'M' of FIG. 2.

Referring to FIGS. 1 and 2, a device isolation layer 102 may be provided on a substrate 100 to define active patterns ACT. As an example, the substrate 100 may be a semiconductor substrate including silicon, germanium, or silicon-germanium. A device isolation layer 102 may be formed in trenches TR in an upper portion of the substrate 100. The device isolation layer 102 may include a silicon oxide layer.

The active patterns ACT may be formed by patterning an upper portion of the substrate 100. Each of the active patterns ACT may be a bar-shaped pattern, which is elongated in a third direction D3, when viewed in a plan view. In other words, each of the active patterns ACT may have a long axis parallel to the third direction D3. The active patterns ACT may be arranged to be parallel to the third direction D3 and to each other, and each active pattern ACT may be disposed to have an end portion adjacent to a center of another active pattern ACT adjacent thereto.

Word lines WL may be provided to cross the active patterns ACT. The word lines WL may be disposed in grooves GRV, which are formed in the device isolation layer 102 and the active patterns ACT. The word lines WL may extend in the third direction D3, which is not parallel to the first direction D1. The word lines WL may be formed of or include at least one of various conductive materials. A gate dielectric layer 107 may be disposed between the word lines WL and the grooves GRV. Although not shown, a bottom surface of the groove GRV may be located at a relatively deep level in the device isolation layer 102 and may be located at a relatively shallow level in the active patterns ACT. The gate dielectric layer 107 may be formed of or include at least one of silicon oxide, silicon nitride, silicon oxynitride, or high-k dielectric materials. Each of the word lines WL may have an uneven bottom surface. For example, a first portion of the bottom surface of the word line WL on the device isolation layer 102 may be lower than a second portion of the bottom surface of the word line WL on the active pattern ACT.

A first source/drain region 112a may be provided in a portion of the active pattern ACT between a pair of the word lines WL, and a pair of second source/drain regions 112b may be provided in opposite edge regions of the active patterns ACT. The first and second source/drain regions 112a and 112b may be doped with impurities (e.g., of n-type). The first source/drain region 112a may correspond to (e.g., may comprise) a common drain region, and the second source/drain region 112b may correspond to (e.g., may comprise) a source region. The word lines WL and the first and second source/drain regions 112a and 112b adjacent thereto may constitute a transistor. Since the word lines WL are disposed in the grooves GRV, a channel region below the word line WL may have an increased channel length within a given planar area. Thus, it may be possible to suppress the short channel effect.

Top surfaces of the word lines WL may be lower than top surfaces of the active patterns ACT. A word line capping pattern 110 may be disposed on each of the word lines WL. The word line capping pattern 110 may be a line-shaped pattern extending in a length direction of the word lines WL and may cover the entire top surface of the word line WL thereunder. The word line capping patterns 110 may be provided in (e.g., to fill) the grooves GRV on the word lines WL. The word line capping pattern 110 may be formed of or include, for example, silicon nitride.

An interlayer insulating pattern 5 may be disposed on the substrate 100. The interlayer insulating pattern 5 may be formed of or include at least one of silicon oxide, silicon nitride, or silicon oxynitride and may have a single- or multi-layered structure. The interlayer insulating patterns 5 may be island-shaped patterns, which are spaced apart from each other, when viewed in a plan view. The interlayer insulating pattern 5 may be provided to cover end portions of a pair of the active portions ACT, which are adjacent to each other.

A recess region 7, which is formed by partially recessing the substrate 100, the device isolation layer 102, and an upper portion of the word line capping pattern 110, may be provided. The recess region 7 may be provided to have a mesh shape in a plan view. A side surface of the recess region 7 may be aligned with a side surface of the interlayer insulating pattern 5.

Bit lines BL may be disposed on the interlayer insulating pattern 5. The bit lines BL may be provided to cross the word line capping patterns 110 and the word lines WL. The bit lines BL may be parallel to a second direction D2 crossing the first and third directions D1 and D3. The bit lines BL may include a bit line polysilicon pattern 130, a bit line diffusion prevention pattern 131, and a bit line metal pattern 132, which are sequentially stacked. The bit line polysilicon pattern 130 may be formed of or include doped or undoped polysilicon. The bit line diffusion prevention pattern 131 may be formed of or include at least one of various metal nitride materials. The bit line metal pattern 132 may be formed of or include at least one of various metallic materials (e.g., tungsten, titanium, tantalum, and so forth). A bit line capping pattern 137 may be disposed on each of the bit lines BL. The bit line capping patterns 137 may include an insulating material. For example, the bit line capping pattern 137 may be formed of or include at least one of nitrides (e.g., silicon nitride) and/or oxynitrides (e.g., silicon oxynitride).

A bit line contact DC may be disposed in the recess region 7 crossing the bit lines BL. The bit line contact DC may be formed of or include doped or undoped polysilicon. A side surface of the bit line contact DC may be in contact with the side surface of the interlayer insulating pattern 5. The side surface of the bit line contact DC in contact with the interlayer insulating pattern 5 may be concave (e.g., see FIG. 1). The bit line contact DC may electrically connect the first source/drain region 112a to the bit line BL.

A lower gapfill insulating pattern 141 may be disposed in a portion of the recess region 7 that is not filled with the bit line contact DC. The lower gapfill insulating pattern 141 may be formed of or include at least one of silicon oxide, silicon nitride, or silicon oxynitride and may have a single- or multi-layered structure.

Storage node contacts BC may be disposed between an adjacent pair of the bit lines BL. The storage node contacts BC may be spaced apart from each other. The storage node contacts BC may be formed of or include doped or undoped polysilicon. The storage node contact BC may have a concave top surface. The storage node contact BC may have a curved bottom surface. The storage node contact BC may be electrically connected to the second source/drain region 112b.

An insulating fence 40 may be disposed between the bit lines BL and between the storage node contacts BC. The insulating fence 40 may be formed of or include at least one of various insulating materials (e.g., silicon nitride, silicon oxide, or silicon oxynitride). In an embodiment, the storage node contacts BC and the insulating fences 40 may be alternately arranged along a side of the bit line BL. The topmost height of the insulating fence 40 may be higher than the topmost height of the storage node contact BC.

A spacer structure SPS may be interposed between the bit line BL and the storage node contact BC. The spacer structure SPS may include a first spacer 21, a second spacer 23, and a third spacer 25.

The first spacer 21 may cover a side surface of the bit line BL and a side surface of the bit line capping pattern 137. The third spacer 25 may be adjacent to the storage node contact BC. The first spacer 21 and the third spacer 25 may be formed of or include the same material. For example, the first spacer 21 and the third spacer 25 may be formed of or include silicon nitride. The first spacer 21 may be spaced apart from the third spacer 25. The second spacer 23 may be interposed between the first spacer 21 and the third spacer 25. The second spacer 23 may be formed of or include a material that is different from each of the first spacer 21 and the third spacer 25. As an example, the second spacer 23 may include a silicon oxide layer.

The spacer structure SPS may extend along the side surface of the bit line BL and may be interposed between the bit line BL and the insulating fence 40. The topmost height of the spacer structure SPS may be higher than a top surface of the bit line BL. The first spacer 21 may extend to cover a side surface of the bit line contact DC and side and bottom surfaces of the recess region 7. In other words, the first spacer 21 may be interposed between the bit line contact DC and the lower gapfill insulating pattern 141, between the word line capping pattern 110 and the lower gapfill insulating pattern 141, between the substrate 100 and the lower gapfill insulating pattern 141, and between the device isolation layer 102 and the lower gapfill insulating pattern 141.

A storage node ohmic layer 9 may be disposed on the storage node contact BC. The storage node ohmic layer 9 may be formed of or include at least one of various metal silicide materials. The storage node ohmic layer 9, the spacer structure SPS, and the bit line capping pattern 137 may be conformally covered with a diffusion prevention pattern 11a. The diffusion prevention pattern 11a may be formed of or include at least one of various metal nitride materials (e.g., titanium nitride or tantalum nitride). An upper spacer 27 may be interposed between the diffusion prevention pattern IIa and the spacer structure SPS. The upper spacer 27 may protect/prevent the bit line BL from being damaged, as will be described below.

A landing pad LP may be disposed on the diffusion prevention pattern 11a. As an example, the landing pad LP may be formed of or include a metal material (e.g., tungsten (W)). An upper portion of the landing pad LP may cover a top surface of the bit line capping pattern 137 and may have a larger width than the storage node contact BC. A center of the landing pad LP may be offset from a center of the storage node contact BC in the first direction D1. A portion of the bit line BL may be vertically overlapped by the landing pad LP. The landing pads LP may be island-shaped patterns, which are spaced apart from each other, when viewed in a plan view. The landing pad LP may be electrically connected to the storage node contact BC.

A first trench TR1 and a second trench TR2 may be formed on the spacer structure SPS and the bit line capping pattern 137. The first trench TR1 may be formed on the second trench TR2. The first and second trenches TR1 and TR2 may be connected to each other to form a single object/opening. The second trench TR2 may be formed between the first trench TR1 and the spacer structure SPS. The smallest width of the first trench TR1 may be smaller than the largest width of the second trench TR2. The largest width of the first trench TR1 may be larger than the largest width of the second trench TR2. The landing pads LP may be spaced apart from each other in the first and second directions D1 and D2 by the first and second trenches TR1 and TR2.

An insulating pattern 146 and a liner 148 may be disposed in the first and second trenches TR1 and TR2. The first and second trenches TR1 and TR2 may be fully filled with the insulating pattern 146 and the liner 148. The insulating pattern 146 may be provided on the spacer structure SPS and adjacent to the landing pad LP. The insulating pattern 146 may define a planar shape of the landing pad LP. When viewed in a plan view, the insulating pattern 146 may be formed to have a mesh shape. The liner 148 may be interposed between the insulating pattern 146 and an inner side surface of the first trench TR1 and between the insulating pattern 146 and an inner side surface of the second trench TR2. The liner 148 may be provided to cover or wrap side and bottom surfaces of the insulating pattern 146. The insulating pattern 146 may be formed of or include an insulating material (e.g., silicon nitride). The liner 148 may be formed of or include at least one of various insulating materials (e.g., silicon nitride or silicon oxide).

A data storage pattern BE may be disposed on the landing pad LP. The data storage pattern BE may be a bottom electrode of a capacitor or a contact plug, which is connected to the bottom electrode of the capacitor. In an embodiment, the data storage pattern BE may include a phase-change pattern, a variable resistance pattern, or a magnetic tunnel junction pattern.

Hereinafter, the insulating pattern 146 and the liner 148 will be described in more detail with reference to FIG. 3.

The insulating pattern 146 may include an upper insulating portion 146u in (e.g., filling) the first trench TR1 and a lower insulating portion 146b in (e.g., filling) the second trench TR2. The upper and lower insulating portions 146u and 146b may be connected to each other to form a single object. Accordingly, the upper and lower insulating portions 146u and 146b may be respective portions of the single object that are connected to each other.

The liner 148 may include an upper liner 148u provided in (e.g., on the inner side surface of) the first trench TR1 and a lower liner 148b provided in (e.g., on the inner side surface of) the second trench TR2. The upper liner 148u may be interposed between the upper insulating portion 146u and the inner side surface of the first trench TR1. The lower liner 148b may be interposed between the lower insulating portion 146b and the inner side surface of the second trench TR2. The upper liner 148u may be provided to cover or wrap a side surface of the upper insulating portion 146u. The lower liner 148b may be provided to cover or wrap side and bottom surfaces of the lower insulating portion 146b. The upper liner 148u may be in contact with the landing pad LP, the diffusion prevention pattern 11a, and the bit line capping pattern 137. The upper liner 148u may be formed of or include at least one of silicon oxide or silicon nitride. The lower liner 148b may be in contact with the landing pad LP, the bit line capping pattern 137, and the spacer structure SPS. In detail, the lower liner 148b may be in contact with the first spacer 21 and the second spacer 23. The lower liner 148b may be formed of or include at least one of various insulating materials (e.g., silicon nitride, silicon oxide, or tungsten nitride). In detail, a portion of the lower liner 148b that is in contact with the landing pad LP may be formed of or include tungsten nitride, and a remaining portion of the lower liner 148b may be formed of or include silicon nitride.

The inner side surface of the first trench TR1 may include an upper side surface ISWu and a lower side surface ISWb. The upper side surface ISWu of the first trench TR1 may have a flat profile. The lower side surface ISWb of the first trench TR1 may have a curved profile. As an example, the lower side surface ISWb of the first trench TR1 may have a concave profile. The lower side surface ISWb of the first trench TR1 may have a first angle θ1 that is defined as an angle relative to a plane parallel to a top surface of the substrate 100. The first angle θ1 may be an acute angle.

A side surface of the insulating pattern 146 may have an inflection point IFP near a boundary between the upper and lower insulating portions 146u and 146b. For example, near the inflection point IFP, a side surface of the upper insulating portion 146u may have a concave profile, and a side surface of the lower insulating portion 146b may have a convex profile. The lower insulating portion 146b may have a rounded bottom surface.

The largest width of the upper insulating portion 146u may be a first width W1. The smallest width of the upper insulating portion 146u may be a second width W2. The first width W1 may be a width of the upper insulating portion 146u measured near a top level of the first trench TR1. The second width W2 may be a width of the upper insulating portion 146u measured at level of the inflection point IFP. The width of the upper insulating portion 146u may decrease gradually in a downward direction.

The largest width of the lower insulating portion 146b may be a third width W3. As a height of a measurement position is lowered (i.e., as the lower insulating portion 146b approaches an upper surface of the substrate 100), the width of the lower insulating portion 146b may increase until it reaches its largest value (i.e., the third width W3) and then may decrease. The third width W3 may be larger than the second width W2. The third width W3 may be smaller than the first width W1.

The largest thickness of the upper liner 148u may be a first thickness T1. The largest thickness of the lower liner 148b may be a second thickness T2. As an example, the first thickness T1 may be larger than the second thickness T2. The thickness of the upper liner 148u measured on the lower side surface ISWb of the first trench TR1 may decrease gradually in a downward direction.

According to an embodiment of the inventive concept, the largest width of the second trench TR2, which is formed below the first trench TR1, may be larger than the smallest width of the first trench TR1. Accordingly, as will be described below, it may be possible to remove a metal material that is formed on a bottom surface of the first trench TR1, during a process of forming the second trench TR2. In other words, it may be possible to inhibit/prevent the metal material from causing a short circuit issue between ones of the landing pads LP that are adjacent to each other.

In addition, since the upper liner 148u is formed on the inner side surface of the first trench TR1, it may be possible to inhibit/prevent upper sidewalls of the landing pads LP from being etched during the process of forming the second trench TR2. Accordingly, it may be possible to inhibit/prevent the landing pad LP from having a reduced cross-sectional area and an increased electrical resistance. As a result, it may be possible to improve electrical characteristics of the semiconductor memory device.

FIGS. 4, 6, 8, 10, 12, 14, 16, 18, and 20 are plan views illustrating a method of fabricating a semiconductor memory device, according to an embodiment of the inventive concept. FIGS. 5, 7, 9, 11, 13, 15, 17, 19, and 21 are sectional views illustrating sections taken along lines A-A', B-B', and C-C' of FIGS. 4, 6, 8, 10, 12, 14, 16, 18, and 20, respectively.

Figure 4:
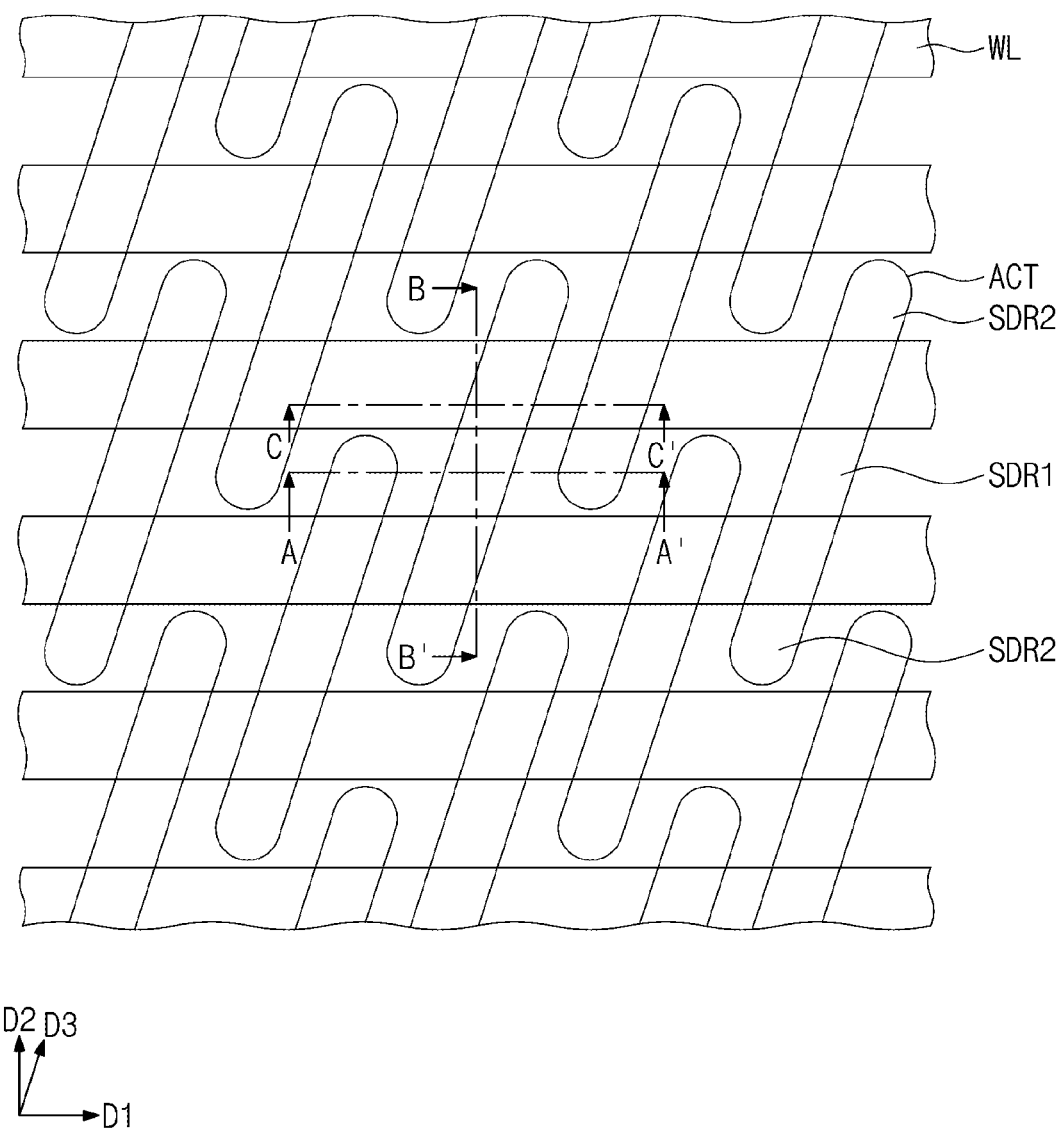
FIGS. 4, 6, 8, 10, 12, 14, 16, 18, and 20 are plan views illustrating a method of fabricating a semiconductor memory device, according to an embodiment of the inventive concept.
Figure 5:
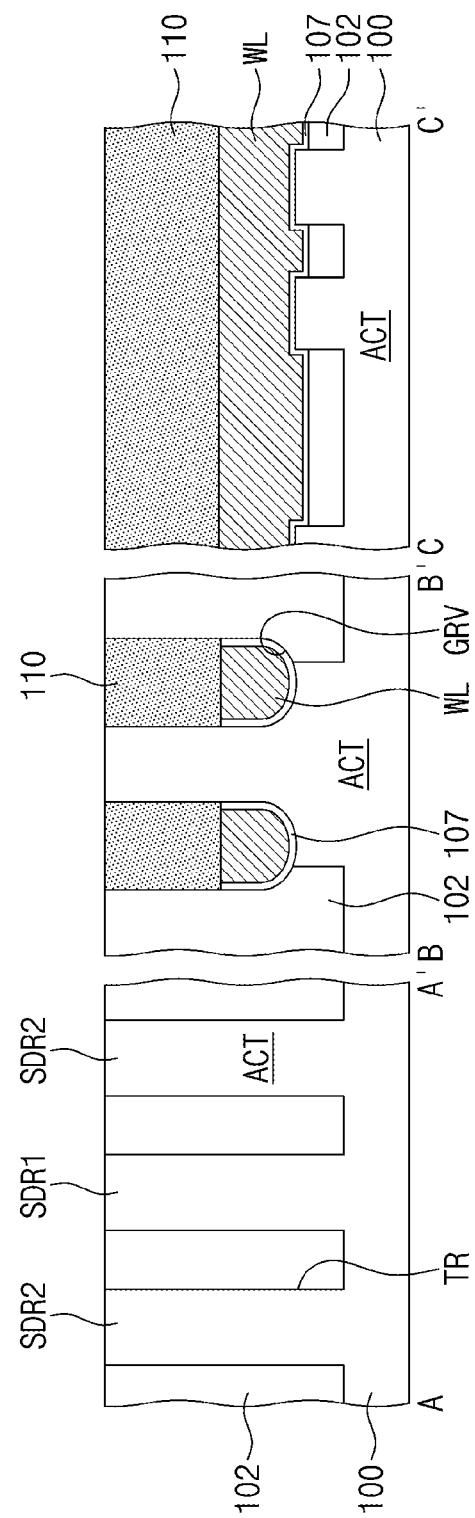
FIGS. 5, 7, 9, 11, 13, 15, 17, 19, and 21 are sectional views illustrating sections taken along lines A-A', B-B', and C-C' of FIGS. 4, 6, 8, 10, 12, 14, 16, 18, and 20, respectively.

Referring to FIGS. 4 and 5, upper portions of the substrate 100 may be patterned to form the active patterns ACT. For example, the trenches TR may be formed by patterning the upper portions of the substrate 100. The device isolation layer 102 may be formed in (e.g., to fill) the trenches TR. The device isolation layer 102 may be formed of or include at least one of, for example, silicon oxide, silicon nitride, or silicon oxynitride. The device isolation layer 102 may define the active patterns ACT.

When viewed in a plan view, the active patterns ACT may be formed to be parallel to in the third direction D3 and to each other. The grooves GRV may be formed by patterning the active patterns ACT and the device isolation layer 102. The groove GRV may have an uneven bottom surface. The bottom surface of the groove GRV may be lower on the device isolation layer 102 than on the substrate 100.

The word lines WL may be formed in the grooves GRV. A pair of the word lines WL may be formed to cross the active patterns ACT. Each of the active patterns ACT may be classified into a first region SDR1 and a pair of second regions SDR2 by the pair of the word lines WL. The first region SDR1 may be defined between the pair of the word lines WL, and the pair of the second regions SDR2 may be defined at opposite edge regions of each active pattern ACT.

Before the formation of the word lines WL, the gate dielectric layer 107 may be formed in the grooves GRV. The gate dielectric layer 107 may be formed by a thermal oxidation process, a chemical vapor deposition process, and/or an atomic layer deposition process. In an embodiment, the gate dielectric layer 107 may include at least one of a silicon oxide layer, a silicon nitride layer, and/or a metal oxide layer. Next, a gate conductive layer may be formed in (e.g., to fill) the grooves GRV, and the word lines WL may be formed by patterning the gate conductive layer. The gate conductive layer may be formed of or include for at least one of doped polysilicon, metal nitride materials, and/or metallic materials. The word lines WL may be vertically recessed to have top surfaces that are lower than top surfaces of the active patterns ACT. The word lines WL may be formed to extend in the third direction D3, which is not parallel to the first direction D1. An insulating layer (e.g., a silicon nitride layer) may be formed on the substrate 100 in (e.g., to fill) the grooves GRV and may be etched to form the word line capping pattern 110 on each of the word lines WL.

Figure 6:
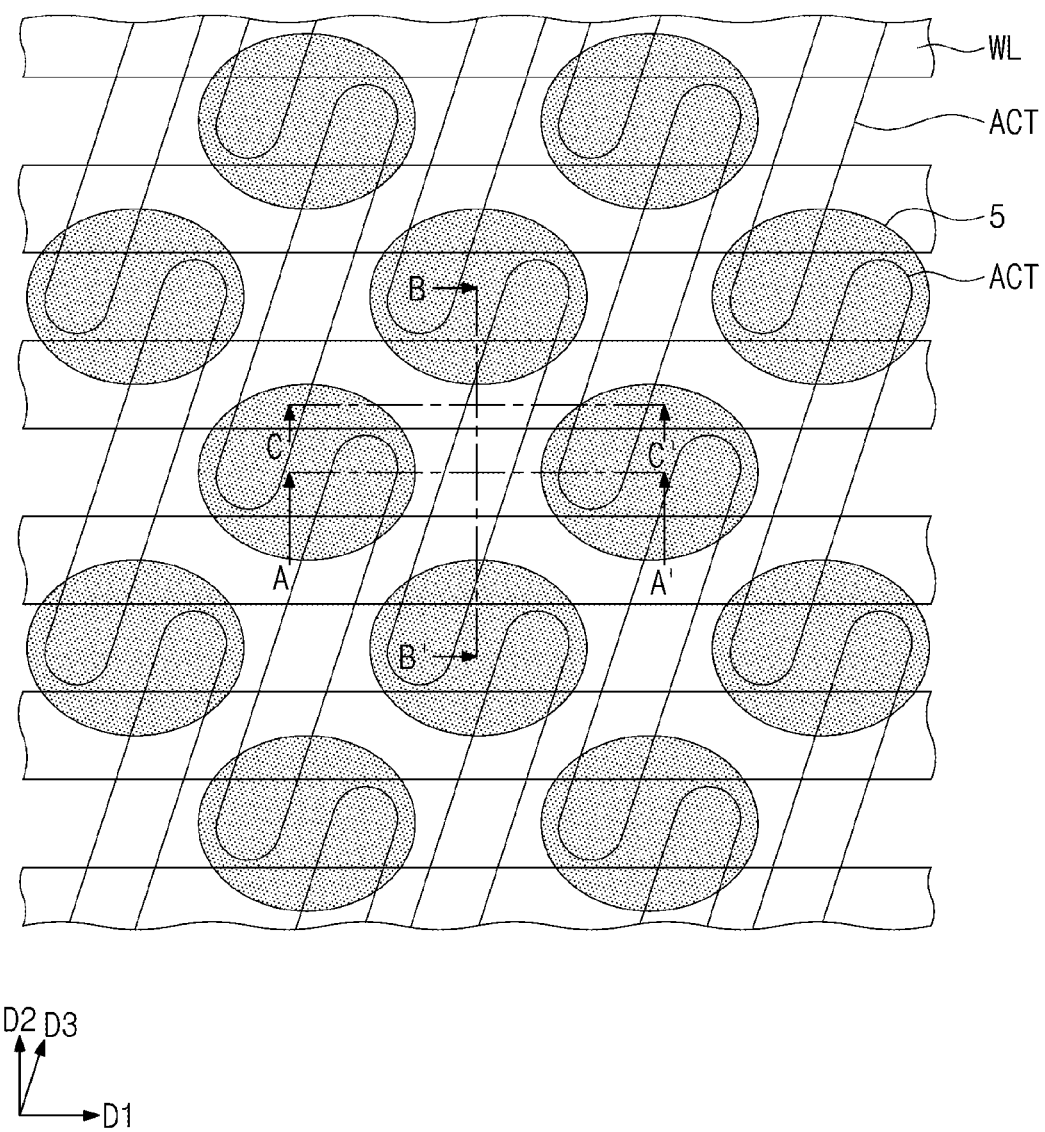
Figure 7:
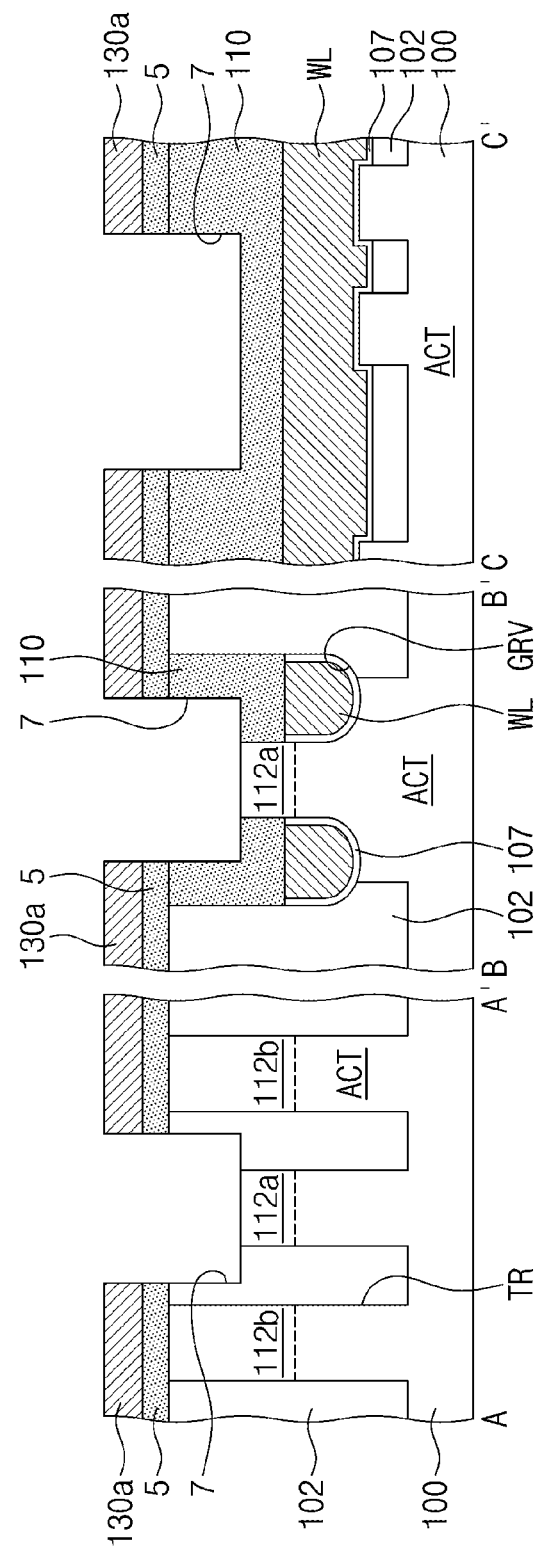

Referring to FIGS. 6 and 7, the first and second source/drain regions 112a and 112b may be formed by injecting dopants into the active patterns ACT using the word line capping patterns 110 and the device isolation layer 102 as a mask. The first source/drain region 112a and the second source/drain regions 112b may be respectively formed in the first region SDR1 and the second regions SDR2 of FIG. 4. An insulating layer and a first poly-silicon layer may be sequentially stacked on the substrate 100. The first poly-silicon layer may be patterned to form a polysilicon mask pattern 130a. The interlayer insulating pattern 5 along with the recess region 7 may be formed by etching the insulating layer, the device isolation layer 102, the substrate 100, and the word line capping pattern 110 using the polysilicon mask pattern 130a as an etch mask. The interlayer insulating pattern 5 may be formed of or include at least one of silicon oxide, silicon nitride, or silicon oxynitride. The interlayer insulating patterns 5 may be formed as island-shaped patterns, which are spaced apart from each other. The interlayer insulating pattern 5 may be formed to cover both of end portions of two adjacent ones of the active patterns ACT. The recess region 7 may be formed to have a mesh shape, when viewed in a plan view. The recess region 7 may be formed to expose the first source/drain regions 112a.

Figure 8:
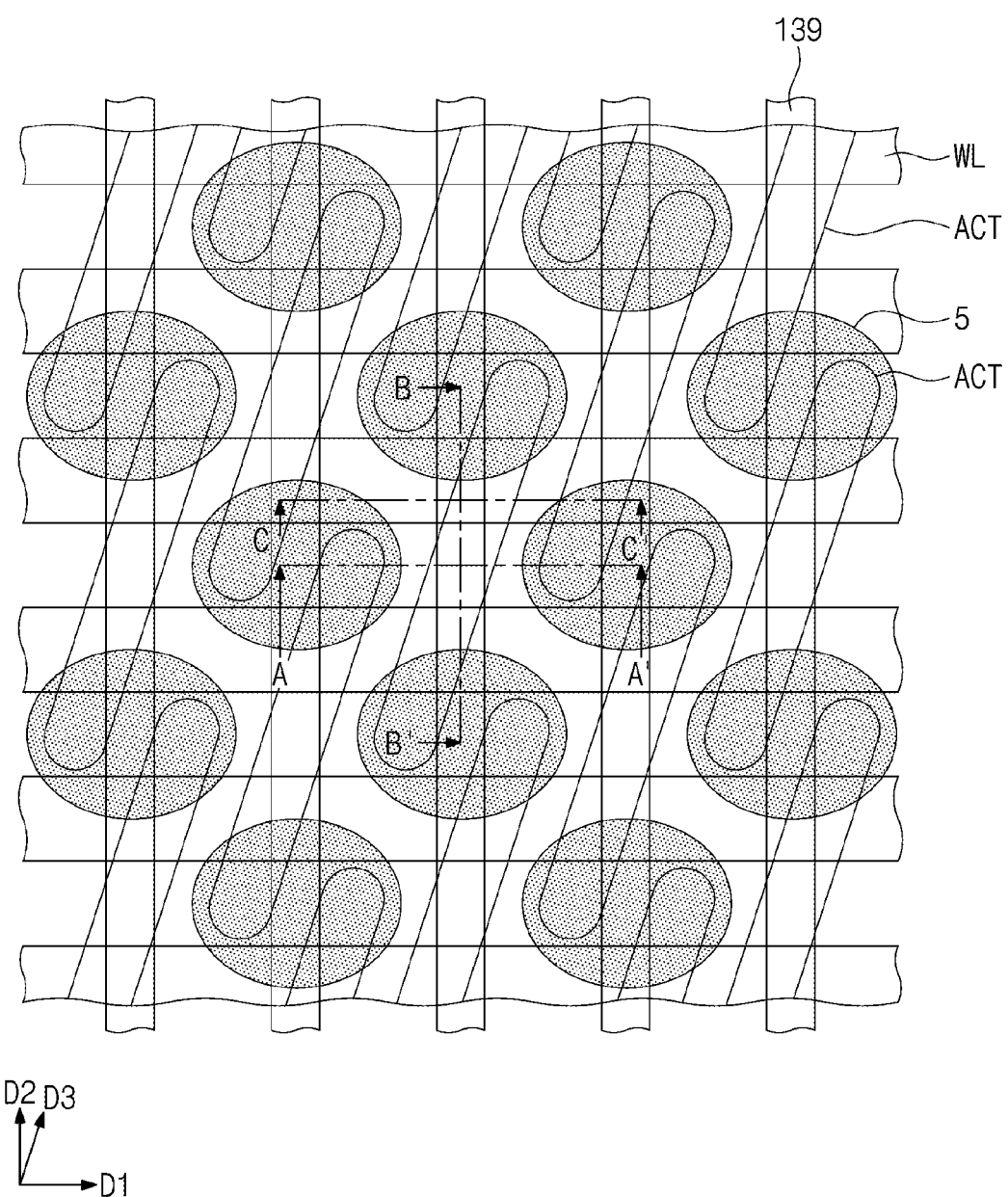
Figure 9:
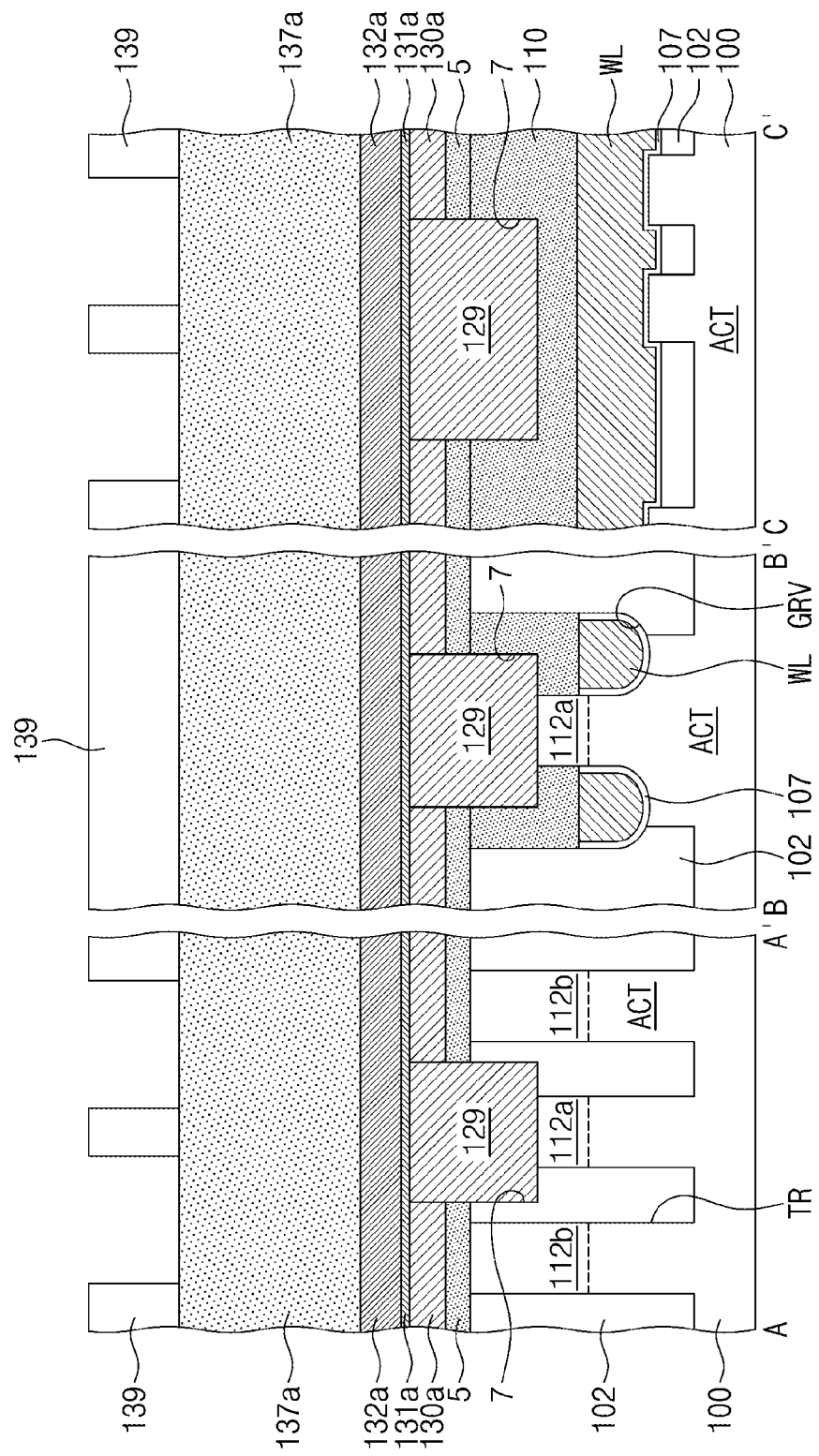

Referring to FIGS. 8 and 9, a second poly-silicon layer 129 may be formed on the substrate 100 in (e.g., to fill) the recess region 7. A planarization etching process may be performed on the second poly-silicon layer 129 to remove a portion of the second poly-silicon layer 129 that is on the polysilicon mask pattern 130a and to expose a top surface of the polysilicon mask pattern 130a. A bit line diffusion barrier layer 131a, a bit line metal layer 132a, and a bit line capping layer 137a may be sequentially stacked on the polysilicon mask pattern 130a and the second poly-silicon layer 129. The bit line diffusion barrier layer 131a may be formed of or include at least one of various metal nitride materials (e.g., titanium nitride).

First mask patterns 139 may be formed on the bit line capping layer 137a to define a planar shape of the bit line BL. The first mask patterns 139 may be formed of or include a material (e.g., amorphous carbon layer (ACL), silicon oxide, and photoresist) having an etch selectivity with respect to the bit line capping layer 137a. The first mask patterns 139 may extend in the second direction D2, which is not parallel to either of the first and third directions D1 and D3.

Figure 10:
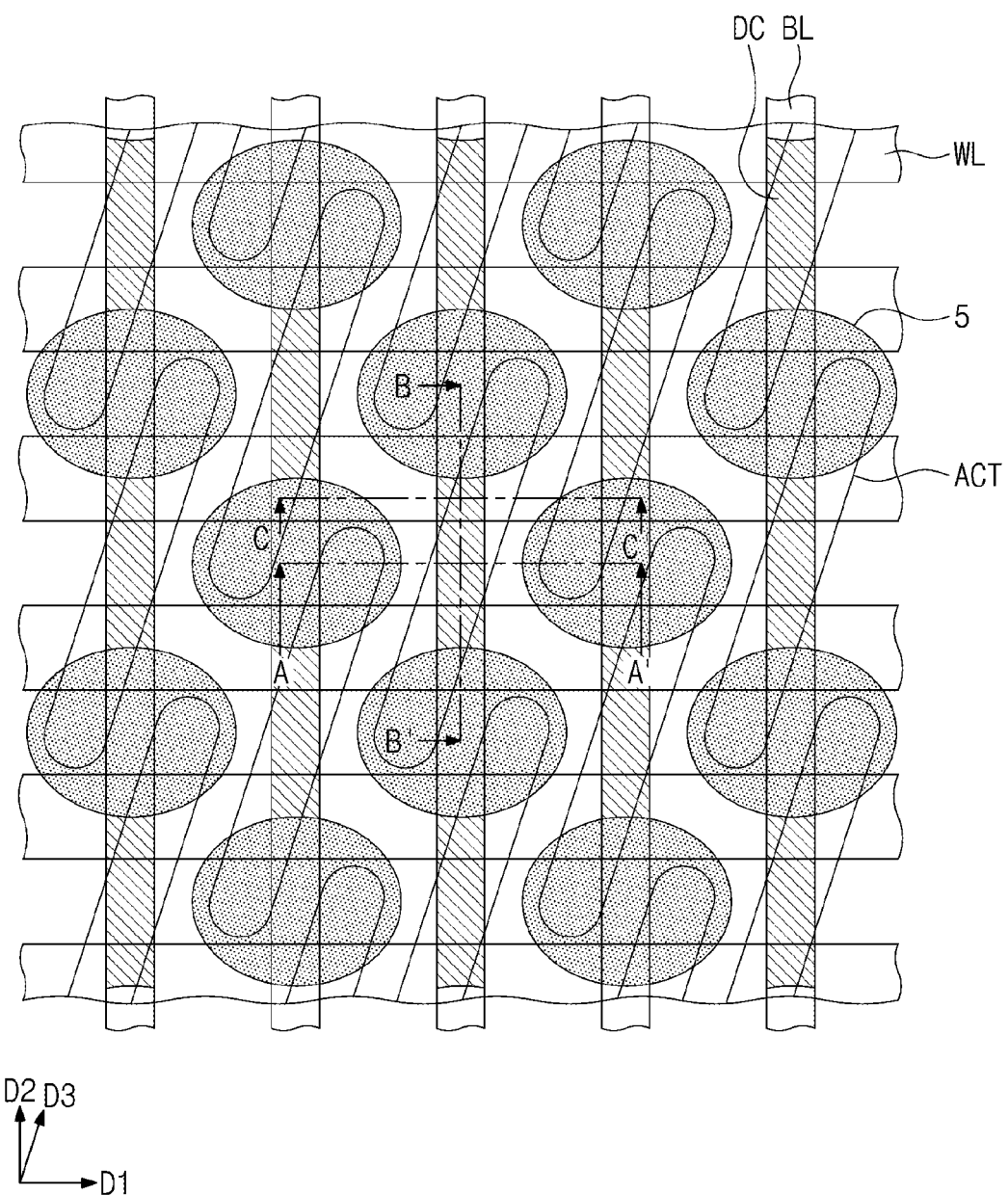
Figure 11:
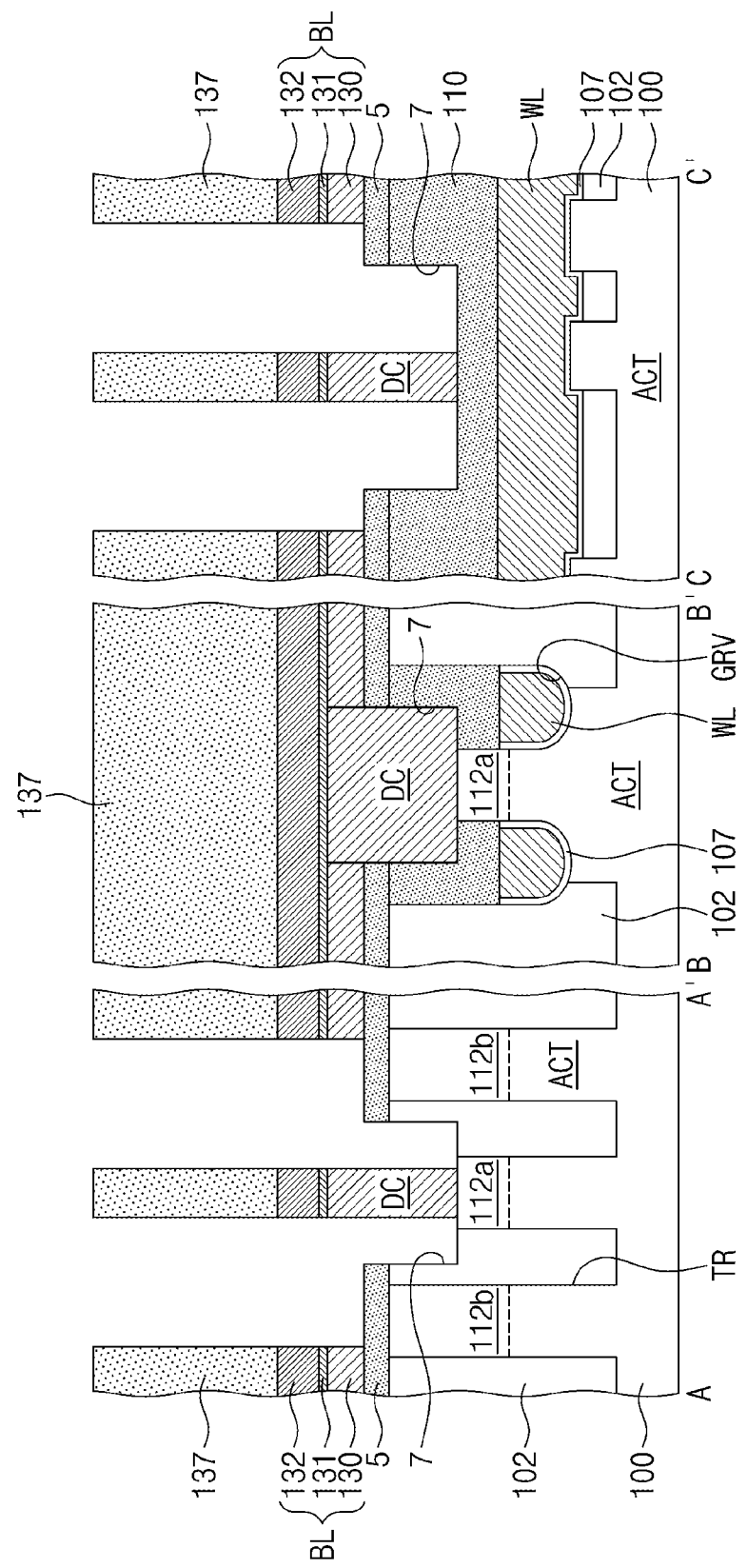

Referring to FIGS. 10 and 11, the bit line BL, the bit line contact DC, and the bit line capping pattern 137 may be formed by etching the bit line capping layer 137a, the bit line metal layer 132a, the bit line diffusion barrier layer 131a, the polysilicon mask pattern 130a, and the second poly-silicon layer 129 using the first mask patterns 139 as an etch mask, and here the bit line BL may be composed of the bit line polysilicon pattern 130, the bit line diffusion prevention pattern 131, and the bit line metal pattern 132. Accordingly, a top surface of the interlayer insulating pattern 5 and an inner side surface and a portion of a bottom surface of the recess region 7 may be exposed. Next, the first mask patterns 139 may be removed.

Figure 12:
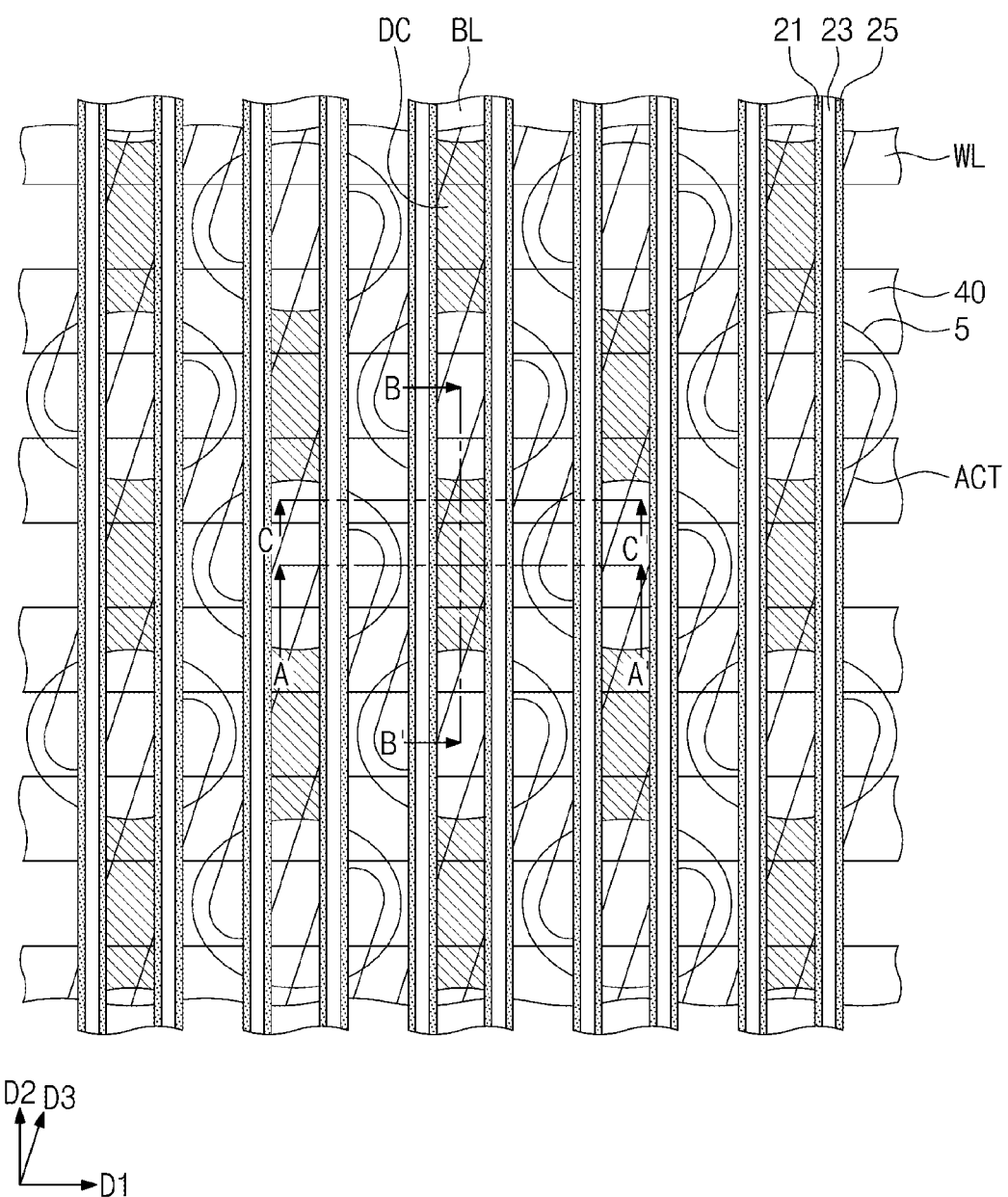
Figure 13:
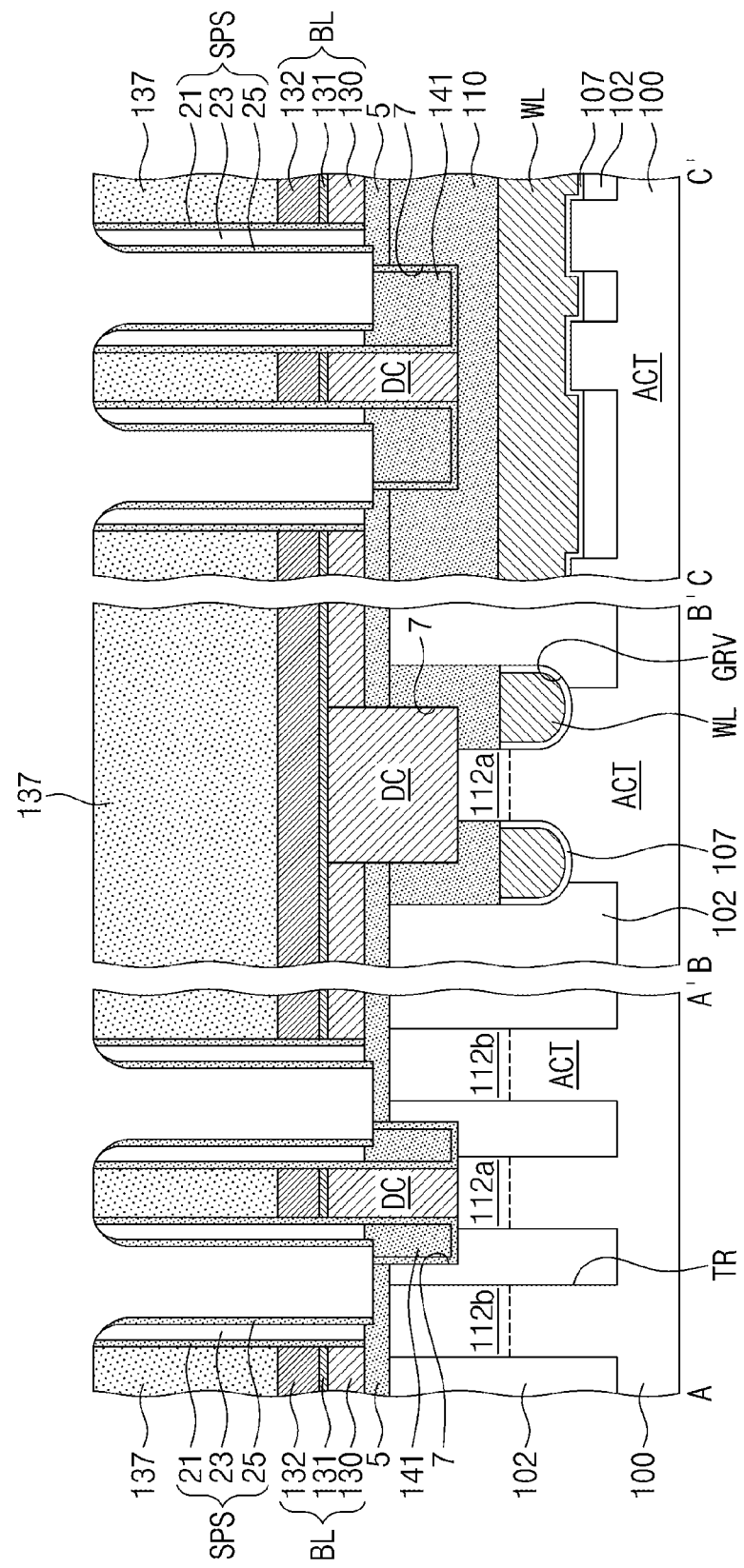

Referring to FIGS. 12 and 13, a first spacer layer may be conformally formed on the substrate 100. In an embodiment, the first spacer layer may be formed to conformally cover the bottom surface and the inner side surface of the recess region 7. The first spacer layer may include, for example, a silicon nitride layer. Thereafter, the lower gapfill insulating pattern 141 may be formed in the recess region 7, and in an embodiment, the formation of the lower gapfill insulating pattern 141 may include forming an insulating layer (e.g., a silicon nitride layer) on the substrate 100 in (e.g., to fill) the recess region 7 and then anisotropically etching the insulating layer. The first spacer layer may also be etched by the anisotropic etching process, and as a result, the first spacer 21 may be formed. Here, the top surface of the interlayer insulating pattern 5 may be exposed. Next, a second spacer layer may be conformally formed on the substrate 100, and an anisotropic etching process may be performed on the second spacer layer to form the second spacer 23 covering a side surface of the first spacer 21. The second spacer 23 may be formed of or include a material having an etch selectivity with respect to the first spacer 21. For example, the second spacer 23 may be formed of or include silicon oxide. The third spacer 25 may be formed to cover a side surface of the second spacer 23. The third spacer 25 may be formed of or include silicon nitride. In an embodiment, the third spacer 25 may be formed using the process of forming the second spacer 23. The formation of the third spacer 25 may be performed to expose the top surface of the interlayer insulating pattern 5.

Figure 14:
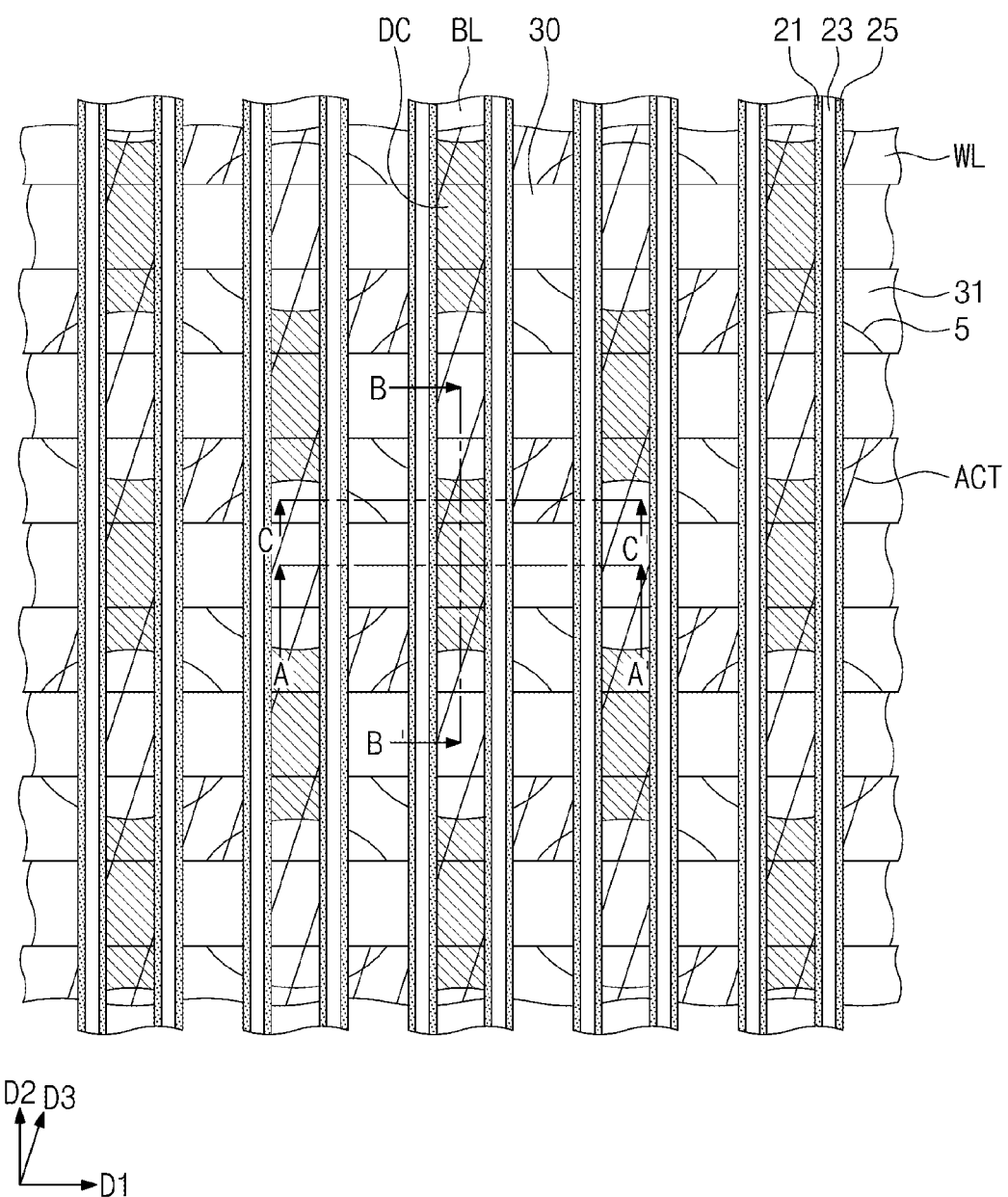
Figure 15:
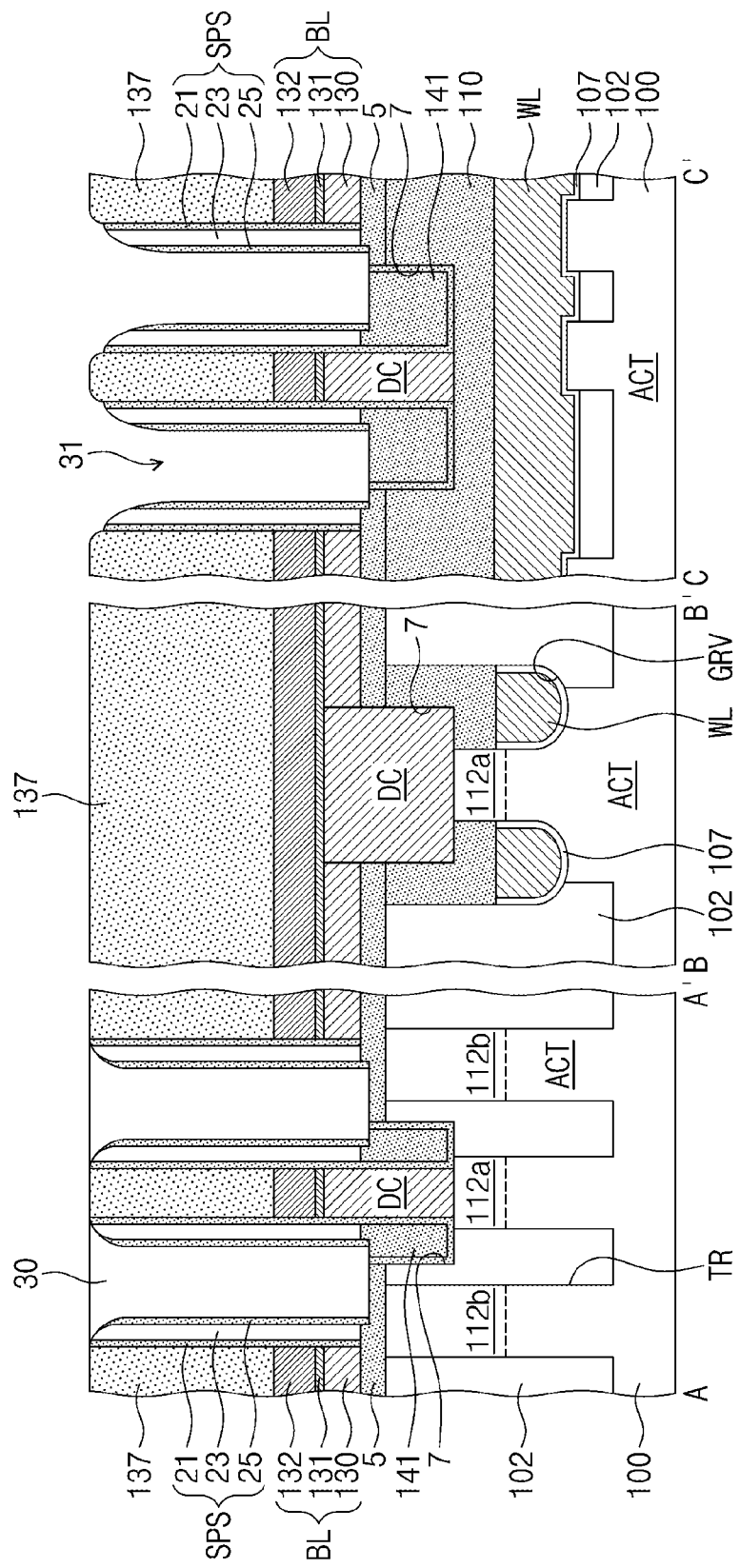

Referring to FIGS. 14 and 15, sacrificial patterns 30 may be formed by forming a sacrificial layer on the substrate 100 and patterning the sacrificial layer, and here, the sacrificial patterns 30 may define positions and arrangement of the storage node contacts BC to be described below. In an embodiment, the sacrificial layer may include an oxide layer (e.g., silicon oxide layer), a carbon-based layer, a polysilicon layer, or a silicon germanium layer. The sacrificial patterns 30 may be formed between the bit lines BL to be spaced apart from each other. The sacrificial patterns 30 may vertically overlap the second source/drain regions 112b.

First openings 31 may be formed between the sacrificial patterns 30 to define positions and arrangement of the insulating fences 40 to be described below. The first openings 31 may vertically overlap the word lines WL. Each of the first openings 31 may be formed to expose not only the top surface of the interlayer insulating pattern 5 but also a top surface of the lower gapfill insulating pattern 141.

Figure 16:
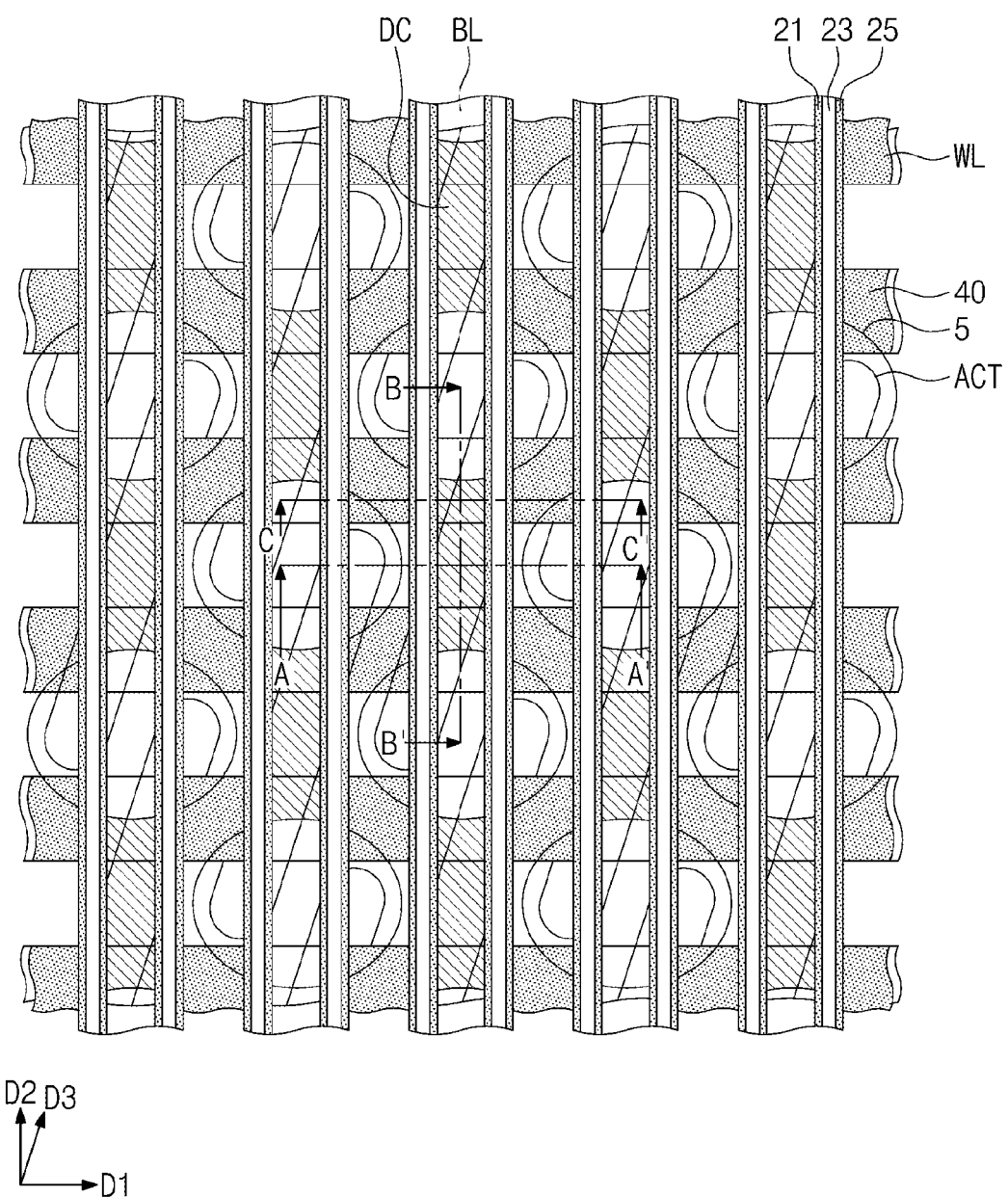
Figure 17:
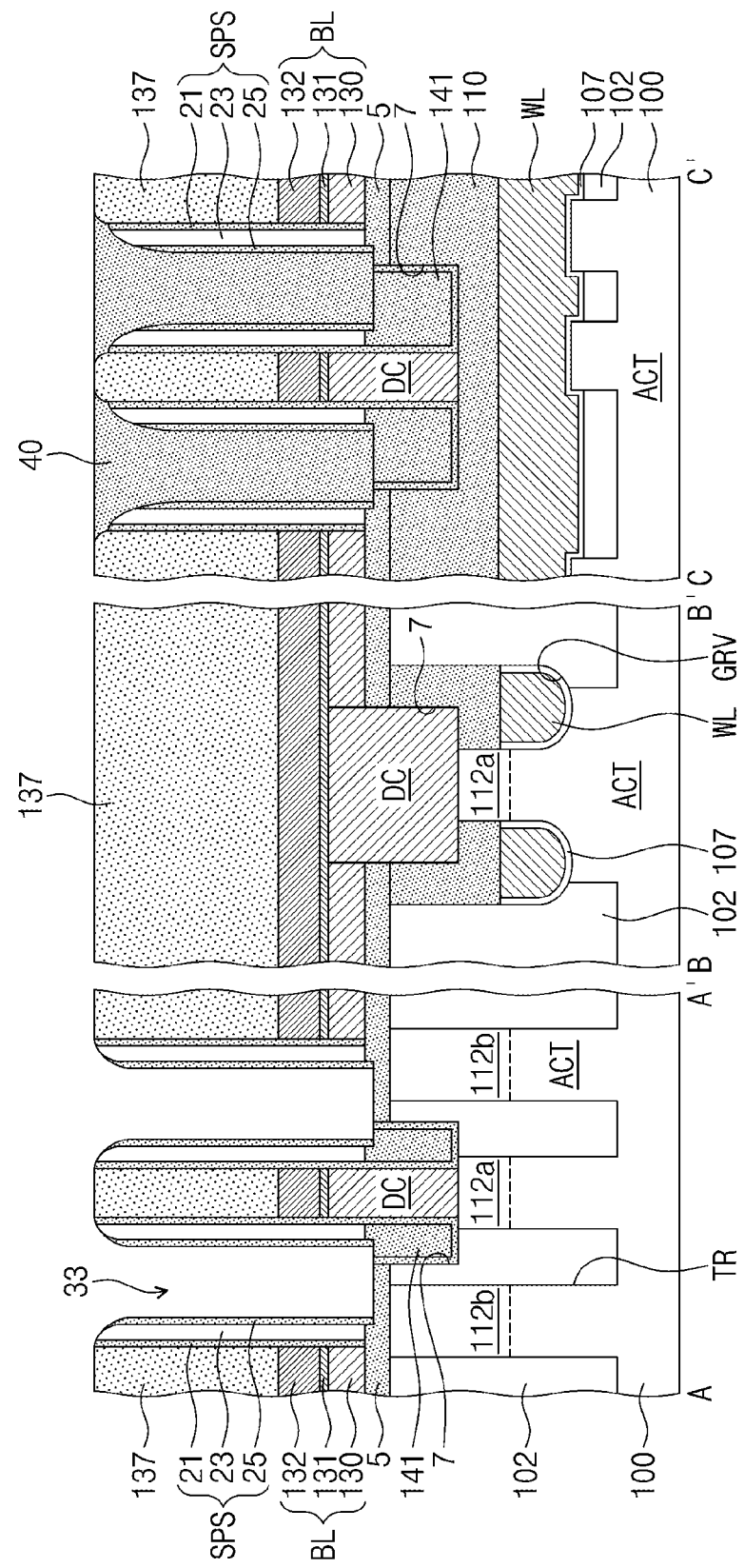

Referring to FIGS. 16 and 17, an insulating layer, such as a silicon nitride layer, may be formed on the substrate 100 in (e.g., to fill) the first openings 31. A planarization etching process may be performed on the insulating layer to expose a top surface of the bit line capping pattern 137, and as a result, the insulating fences 40 may be formed in the first openings 31. Thereafter, the sacrificial patterns 30 may be removed to form second openings 33 exposing the interlayer insulating patterns 5 that vertically overlap the second source/drain regions 112b.

Figure 18:
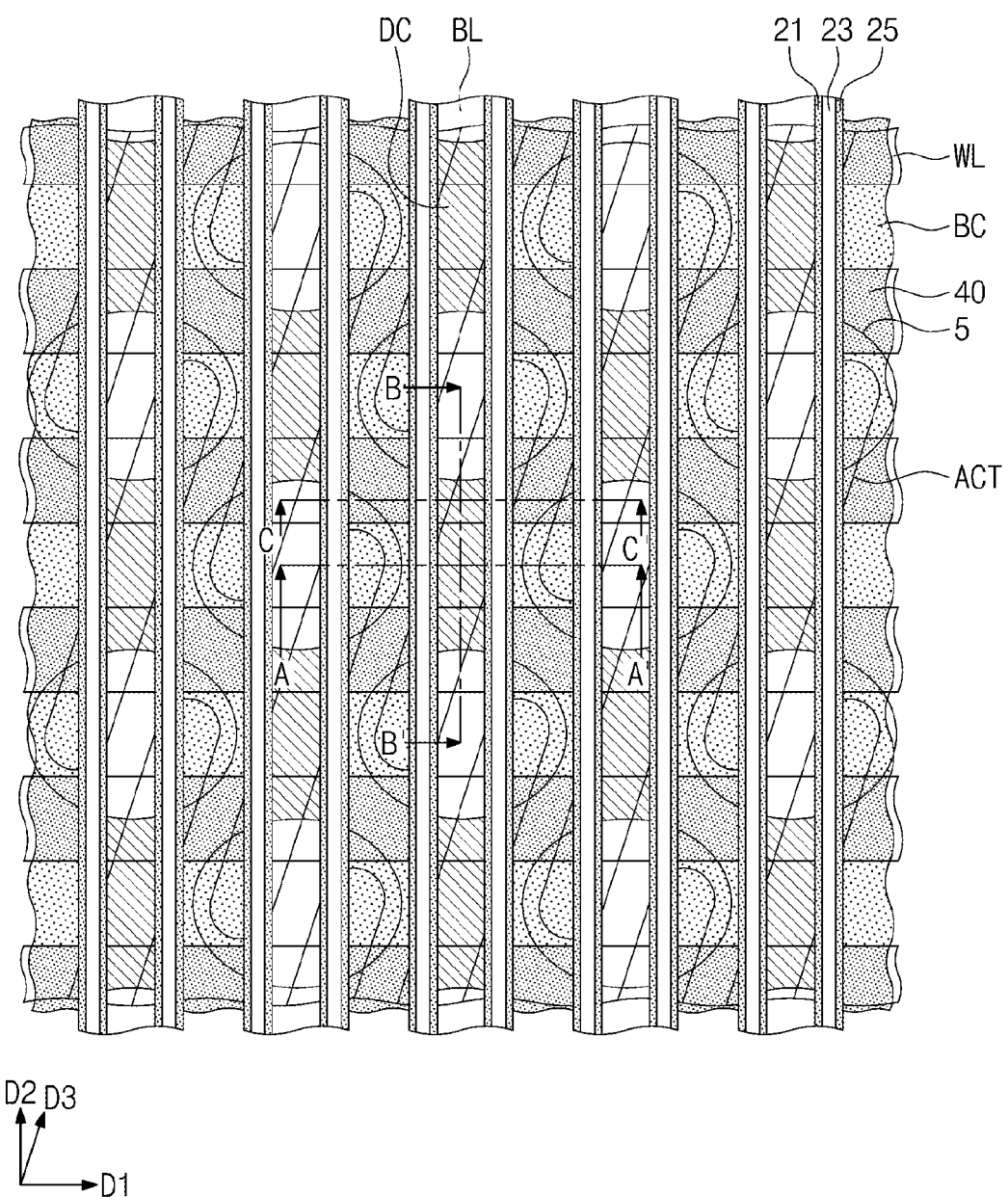
Figure 19:
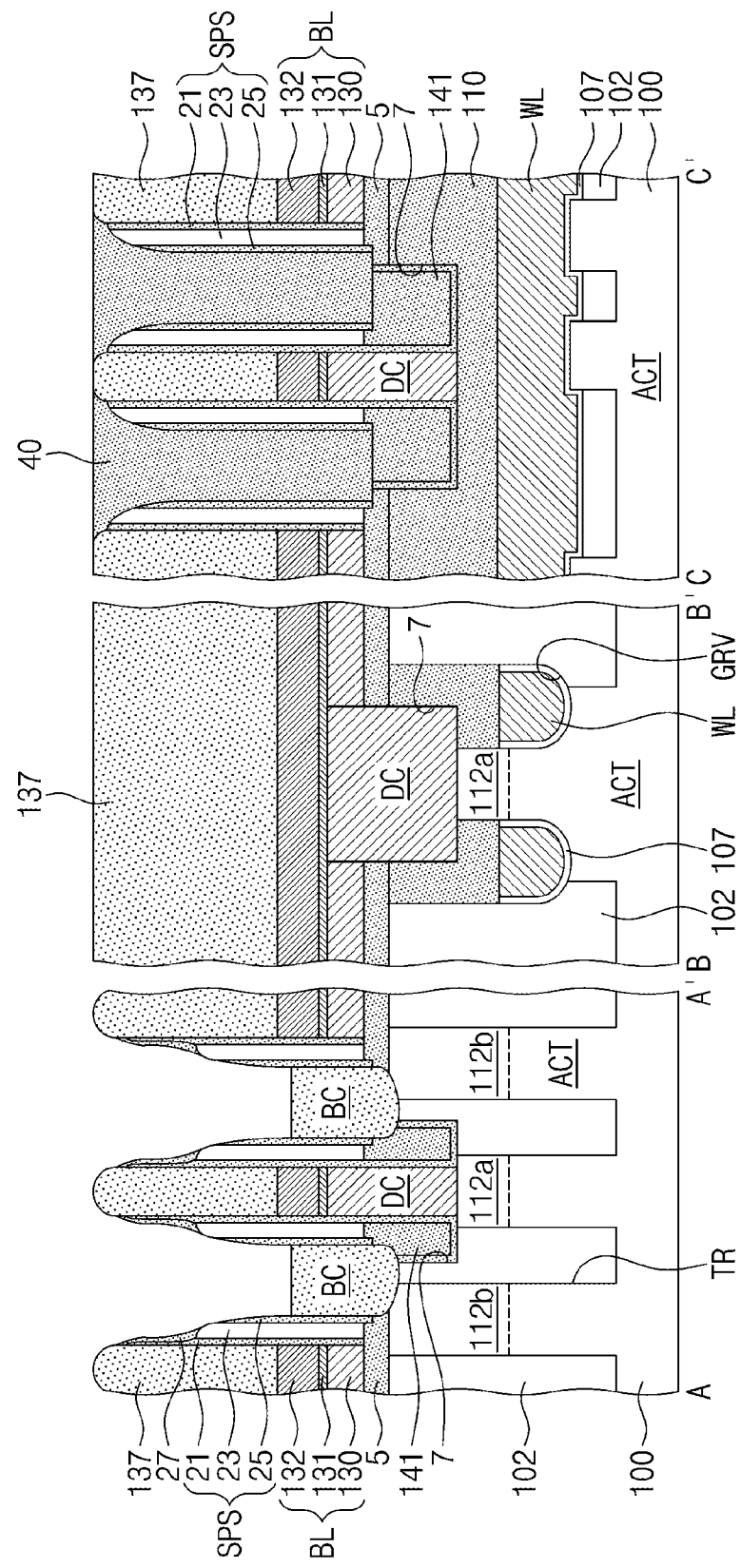

Referring to FIGS. 18 and 19, portions of the interlayer insulating pattern 5, the device isolation layer 102, and the substrate 100 that are located below and exposed through the second openings 33 may be removed to expose the second source/drain region 112b. Thereafter, a preliminary storage node contact (not shown) may be formed by forming a poly-silicon layer on the substrate 100 in (e.g., to fill) the second openings 33 and etching the poly-silicon layer. The preliminary storage node contact may be formed to have a top surface that is lower than top ends of the first, second, and third spacers 21, 23, and 25. Thus, the first, second, and third spacers 21, 23, and 25 may have upper portions that are exposed. The upper portions of the second and third spacers 23 and 25 may be removed such that top ends of the second and third spacers 23 and 25 are located at a level similar to the top surface of the preliminary storage node contact. In this case, an upper side surface of the first spacer 21 may be exposed. This may make it possible to increase a process margin in a subsequent process of forming the landing pad LP.

Next, the upper spacer 27 may be formed to cover the exposed upper side surface of the first spacer 21, and the formation of the upper spacer 27 may include conformally forming an upper spacer layer on the substrate 100 and anisotropically etching the upper spacer layer. Here, an exposed top end of the second spacer 23 may be covered with a lower portion of the upper spacer 27. Thereafter, the storage node contact BC may be formed by etching the preliminary storage node contact to expose an upper side surface of the third spacer 25. In an embodiment, the upper spacer 27 may be formed to reinforce a damaged upper portion of the first spacer 21 and to cover the second spacer 23, and thus, it may be possible to inhibit/prevent an etchant material and a cleaning solution respectively used in the process of etching the storage node contact BC and in a subsequent cleaning process from being supplied toward the bit line BL. Accordingly, it may be possible to protect/prevent the bit line BL from being damaged.

Figure 20:
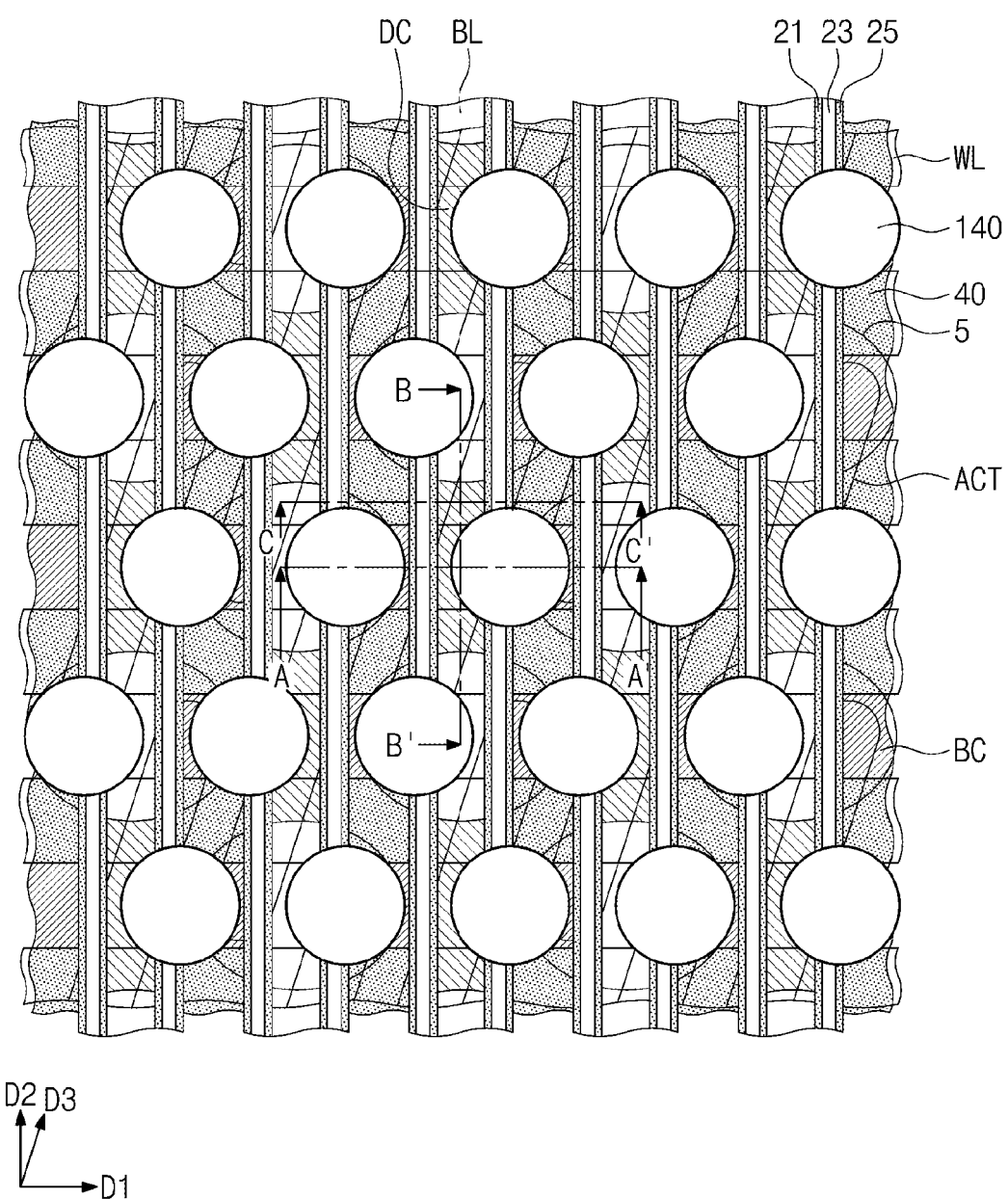
Figure 21:
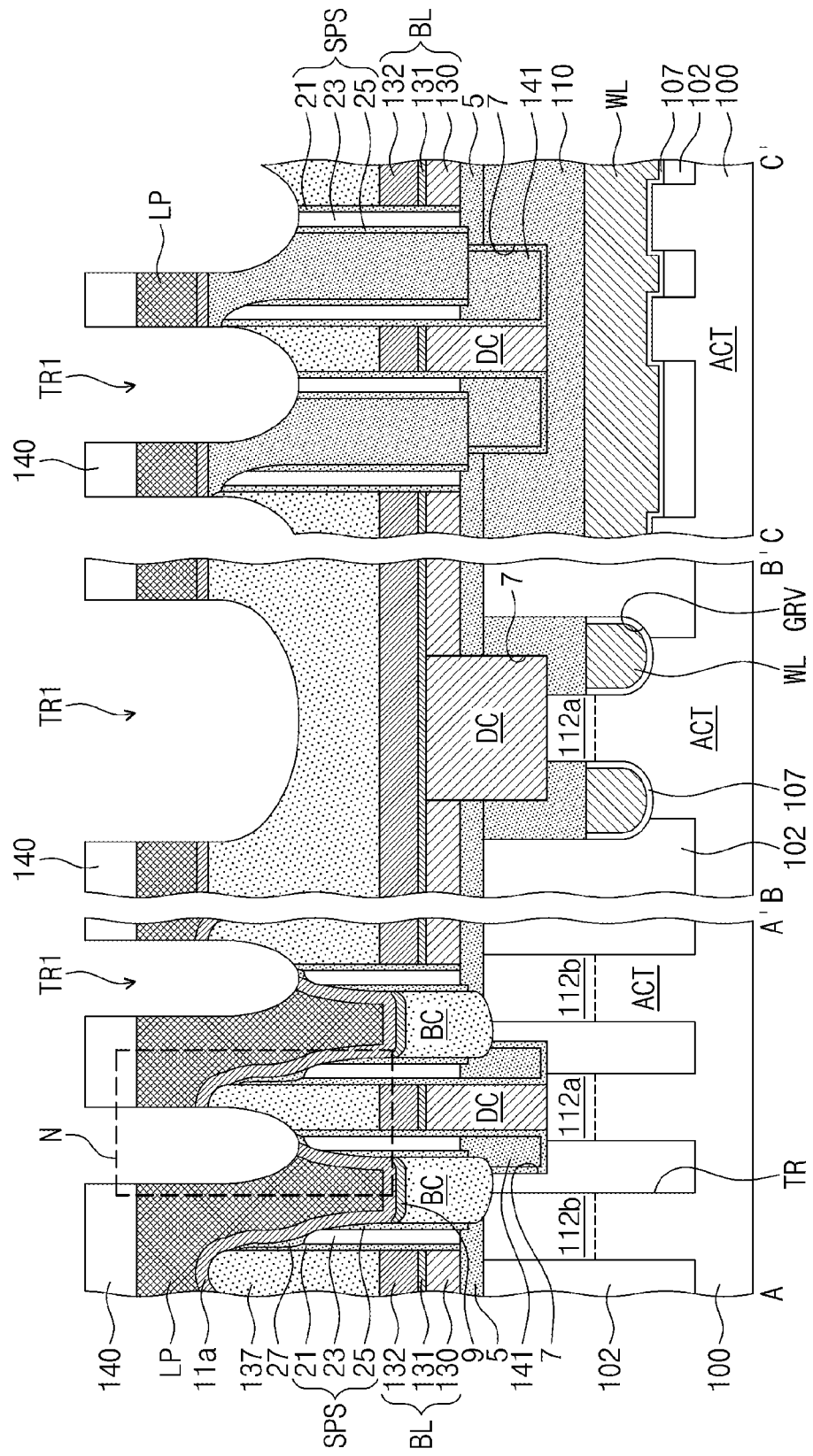

Referring to FIGS. 20 and 21, a cleaning process may be performed to clean a top surface of the storage node contact BC. The storage node ohmic layer 9 may be formed by performing a metal-silicidation process on the top surface of the storage node contact BC. The storage node ohmic layer 9 may be formed of or include at least one of various metal silicide materials (e.g., cobalt silicide). A diffusion barrier layer may be conformally formed on the substrate 100. The diffusion barrier layer may include, for example, a titanium nitride layer or a tantalum nitride layer. A landing pad layer may be formed on the substrate 100 in (e.g., to fill) a space between the bit line capping patterns 137. The landing pad layer may be formed of or include, for example, tungsten. Second mask patterns 140 may be formed on the landing pad layer. The second mask patterns 140 may be formed of or include, for example, ACL. The second mask patterns 140 may define positions and arrangement of the landing pads LP to be described below. The second mask patterns 140 may be formed to vertically overlap the storage node contacts BC. The second mask patterns 140 may be island-shaped patterns that are spaced apart from each other.

The landing pad layer, the diffusion barrier layer, and the bit line capping pattern 137 may be etched using the second mask patterns 140 as an etch mask to form the landing pad LP and the diffusion prevention pattern 11a and to form the first trench TR1.

Although not shown, there may be a residue of the landing pad layer left in the first trench TR1. For example, a portion of the landing pad layer that is formed of or includes a metallic material (e.g., tungsten) may not be removed by the above process and may be left on the inner side surface of the first trench TR1. In this case, a short circuit may be formed between adjacent ones of the landing pads LP.

FIGS. 22A to 22D are enlarged sectional views illustrating a method of forming an insulating pattern and a liner according to an embodiment of the inventive concept and illustrating a portion 'N' of FIG. 21.

Figure 22A:
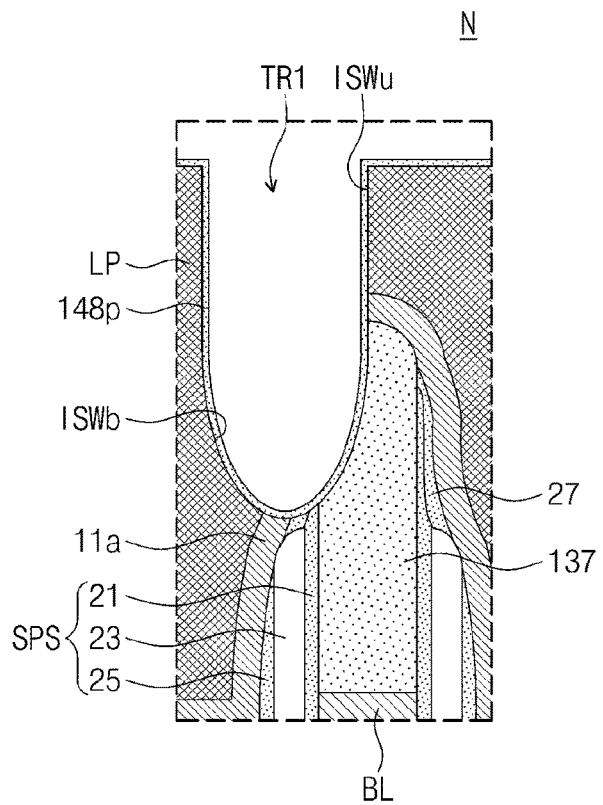
FIGS. 22A to 22D are enlarged sectional views illustrating a method of forming an insulating pattern and a liner according to an embodiment of the inventive concept and illustrating a portion 'N' of FIG. 21.

Referring to FIG. 22A, a preliminary liner 148p may be formed in the first trench TR1. The preliminary liner 148p may be formed using a deposition process. For example, the preliminary liner 148p may be formed using an atomic layer deposition process. The preliminary liner 148p may be formed of or include one of various insulating materials (e.g., silicon nitride or silicon oxide). The preliminary liner 148p may be formed to conformally cover an inner side surface and a bottom surface of the first trench TR1 and top surfaces of the landing pads LP.

Figure 22B:
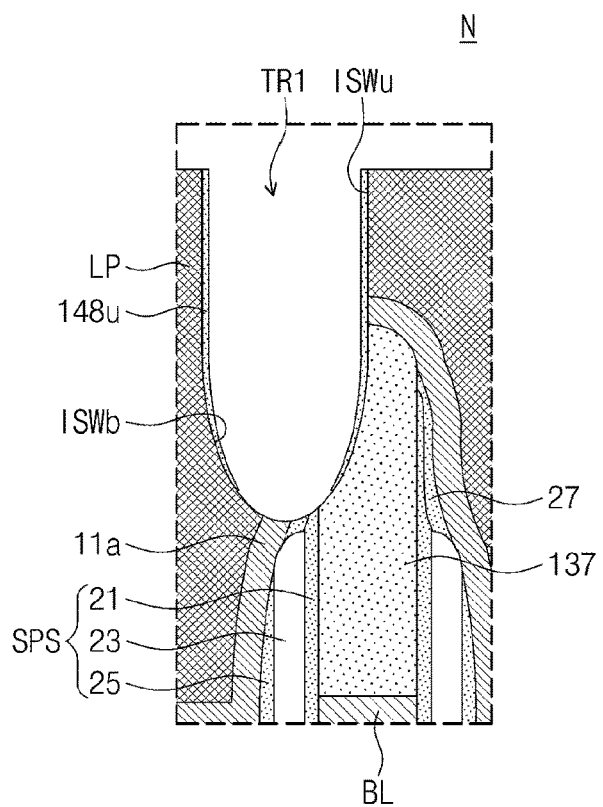

Referring to FIG. 22B, portions of the preliminary liner 148p may be etched to form the upper liner 148u. In detail, portions of the preliminary liner 148p that are formed on the top surfaces of the landing pads LP and the bottom surface of the first trench TR1 may be etched. For example, the etching process of the preliminary liner 148p may be performed to expose the bottom surface of the first trench TR1, and in this case, a remaining portion of the preliminary liner 148p may constitute the upper liner 148u.

Figure 22C:
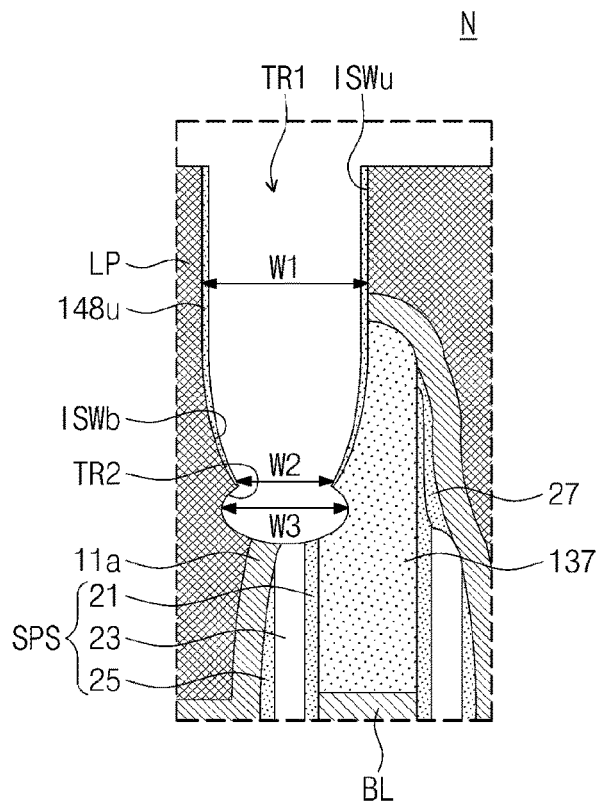

Referring to FIG. 22C, the second trench TR2 may be formed below the first trench TR1. The second trench TR2 may be formed by performing an etching process on the exposed bottom surface of the first trench TR1 using the upper liner 148u as an etch mask.

The second trench TR2 may be formed to expose portions of the bit line capping pattern 137, the spacer structure SPS, and the diffusion prevention pattern 11a. The largest width of the first trench TR1 may be the first width W1. The smallest width of the first trench TR1 may be the second width W2. The largest width of the second trench TR2 may be the third width W3. The third width W3 may be larger than the second width W2. The third width W3 may be smaller than the first width W1.

By forming the second trench TR2, it may be possible to remove the residue of the landing pad layer, which was described with reference to FIG. 21, from the bottom surface of the first trench TR1. Accordingly, adjacent ones of the landing pads LP may be electrically separated from each other, and it may be possible to inhibit/prevent a short circuit from being formed therebetween. In addition, since the upper liner 148u is formed on the inner side surface of the first trench TR1, it may be possible to inhibit/prevent upper sidewalls of the landing pads LP from being etched during the process of forming the second trench TR2. Accordingly, it may be possible to inhibit/prevent the landing pad LP from having a reduced cross-sectional area and an increased electrical resistance. As a result, it may be possible to improve electrical characteristics of the semiconductor memory device.

Figure 22D:
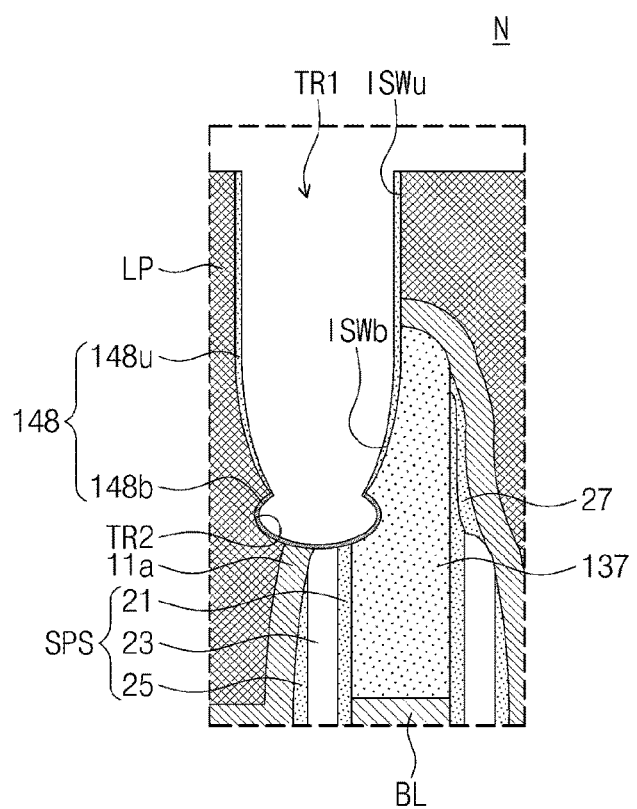

Referring to FIG. 22D, the lower liner 148b may be formed on an inner side surface and a bottom surface of the second trench TR2. The lower liner 148b may be formed by a plasma deposition process using a nitrogen-containing precursor. In detail, the lower liner 148b may be formed by a chemical reaction between the nitrogen precursor with tungsten atoms, which are included in the landing pad LP exposed by the second trench TR2, or with silicon atoms, which are included in the spacer structure SPS and the bit line capping pattern 137 exposed by the second trench TR2.

Here, the upper liner 148u may also react with the nitrogen precursor, and in this case, the upper liner 148u may be thickened to have a thickness that is larger than or close to that of the upper liner 148u of FIG. 22C. The largest thickness of the upper liner 148u may be larger than the largest thickness of the lower liner 148b.

Referring back to FIGS. 1 to 3, the insulating pattern 146 may be formed in (e.g., to fill) remaining portions of the first and second trenches TR1 and TR2. The insulating pattern 146 may include the upper and lower insulating portions 146u and 146b, which are respectively formed in (e.g., to fill) the first and second trenches TR1 and TR2. The data storage pattern BE may be formed on the landing pad LP.

Figure 23:
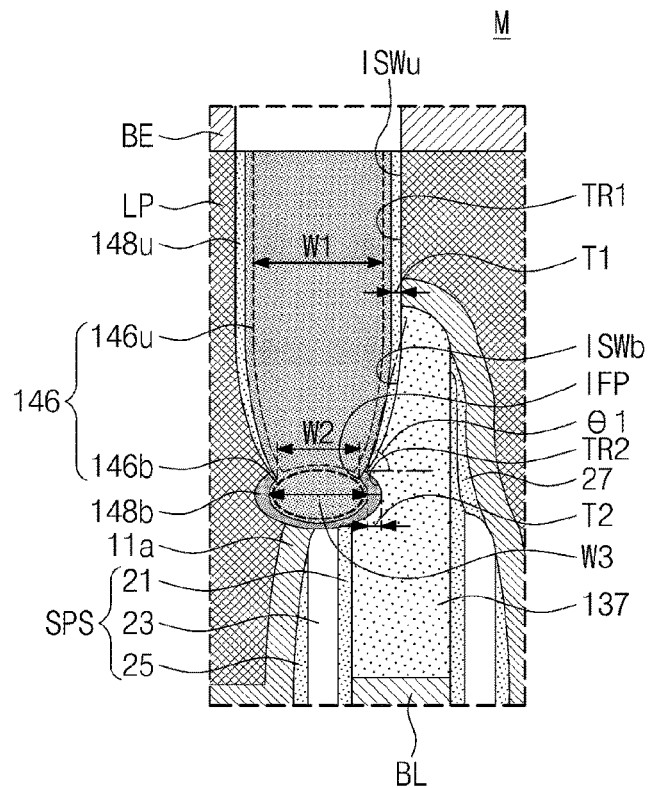
FIGS. 23 and 24 are enlarged sectional views illustrating a portion (e.g., 'M' of FIG. 2) of a semiconductor memory device according to an embodiment of the inventive concept.
Figure 24:
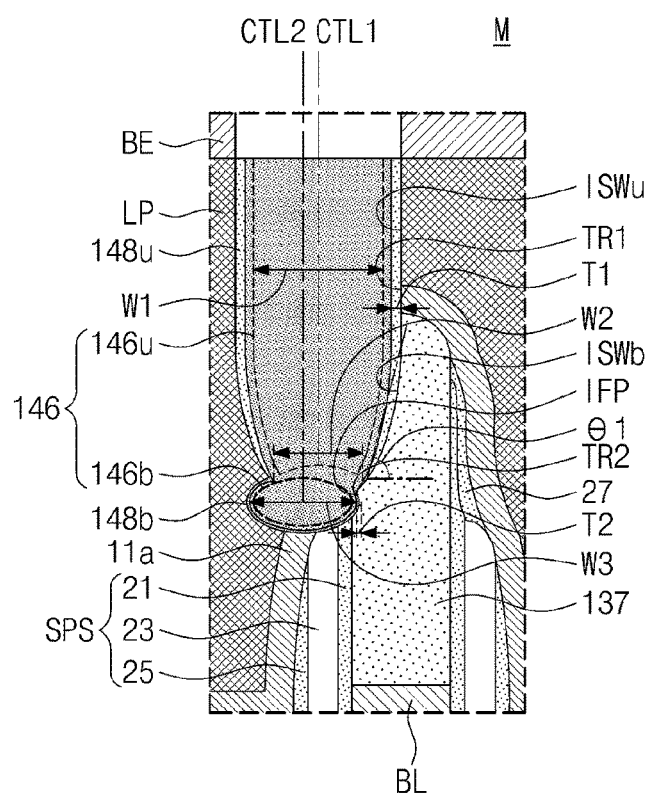

FIGS. 23 and 24 are enlarged sectional views illustrating a portion (e.g., 'M' of FIG. 2) of a semiconductor memory device according to an embodiment of the inventive concept. In the following description of FIGS. 23 and 24, an element previously described with reference to FIGS. 1 to 3 may be identified by the same reference number without repeating an overlapping description thereof, for concise description.

Referring to FIG. 23, the largest thickness of the upper liner 148u may be a first thickness T1. The largest thickness of the lower liner 148b may be a second thickness T2. The first thickness T1 may be substantially equal to the second thickness T2. As an example, a ratio of the first thickness T1 to the second thickness T2 may range from 0.9 to 1.1.

Referring to FIG. 24, a first imaginary line CTL1 may be defined to pass through a center of the upper insulating portion 146u and to be perpendicular to the top surface of the substrate 100. A second imaginary line CTL2 may be defined to pass through a center of the lower insulating portion 146b and to be perpendicular to the top surface of the substrate 100. In an embodiment, the first imaginary line CTL1 may be offset from the second imaginary line CTL2 in a direction parallel to the top surface of the substrate 100. Accordingly, a center point of the largest width W3 of the lower insulating portion 146b may be horizontally offset (e.g., in the first direction D1) from a center point of the smallest width W2 of the upper insulating portion 146u. The first imaginary line CTL1 may be closer to the bit line BL than the second imaginary line CTL2. In an embodiment, the second imaginary line CTL2 may be closer to the bit line BL than the first imaginary line CTL1, unlike the illustrated example.

Figure 25:
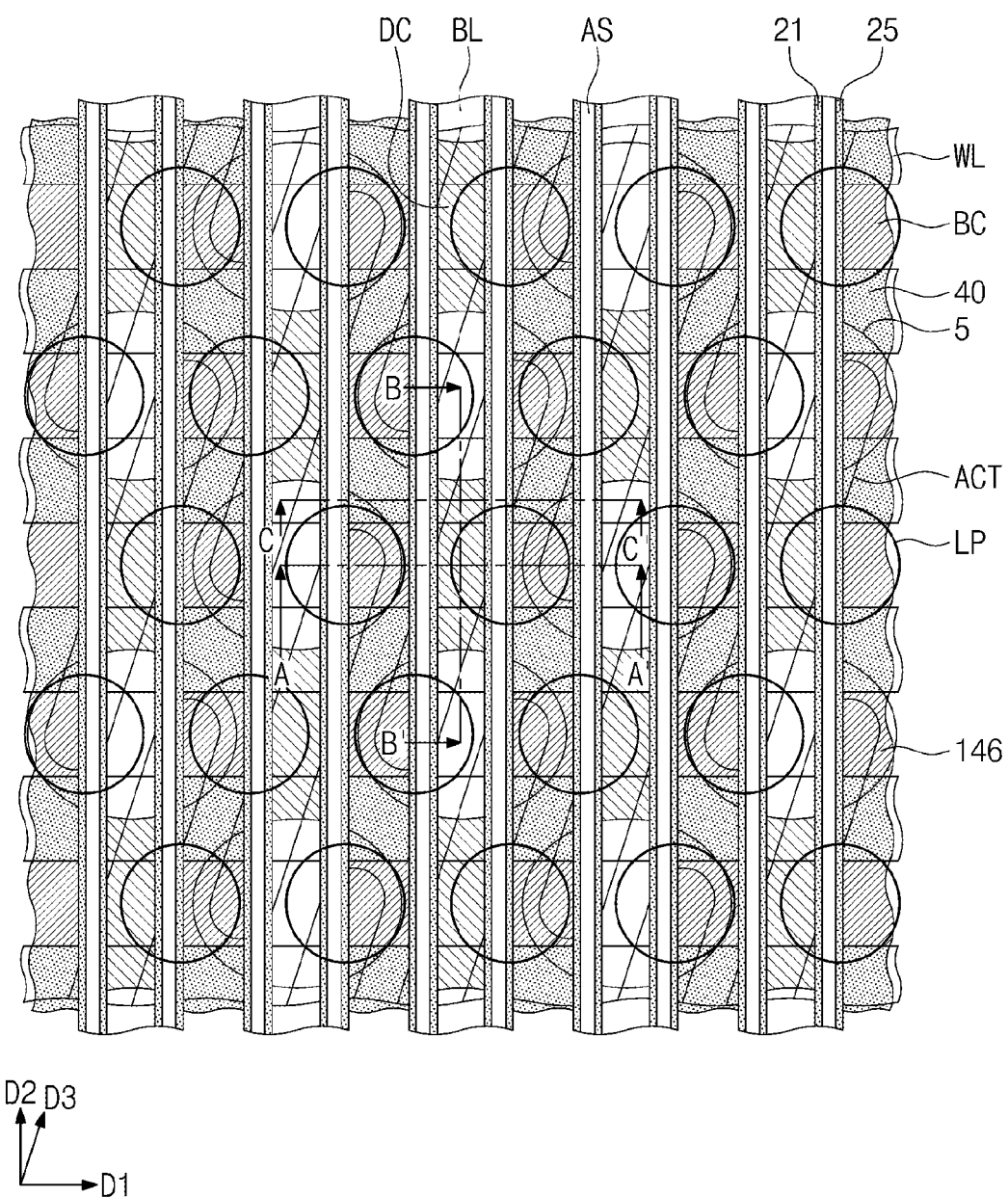
FIG. 25 is a plan view illustrating a semiconductor memory device according to an embodiment of the inventive concept.
Figure 26:
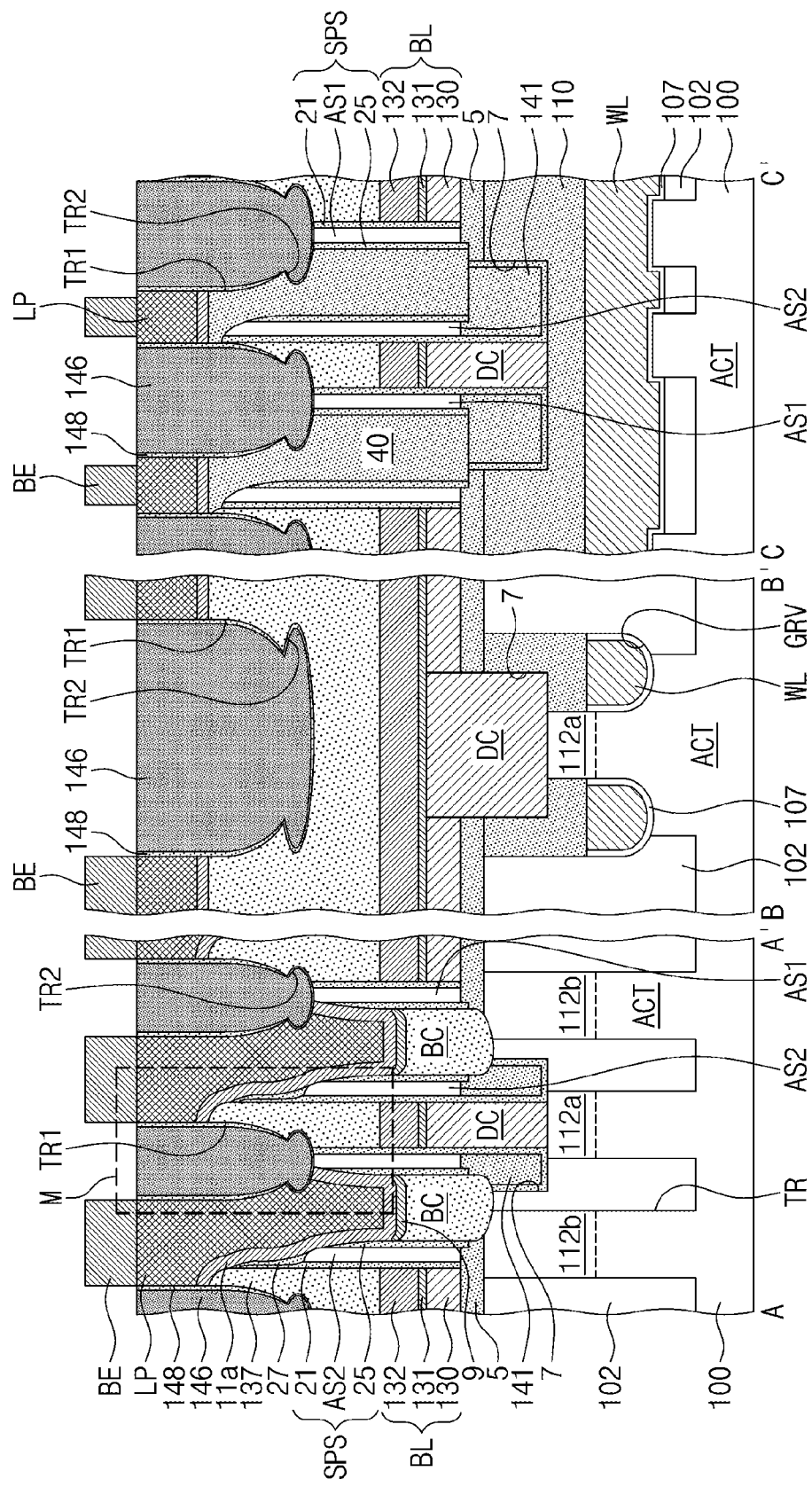
FIG. 26 is a sectional view illustrating sections taken along lines A-A', B-B', and C-C' of FIG. 25.
Figure 27:
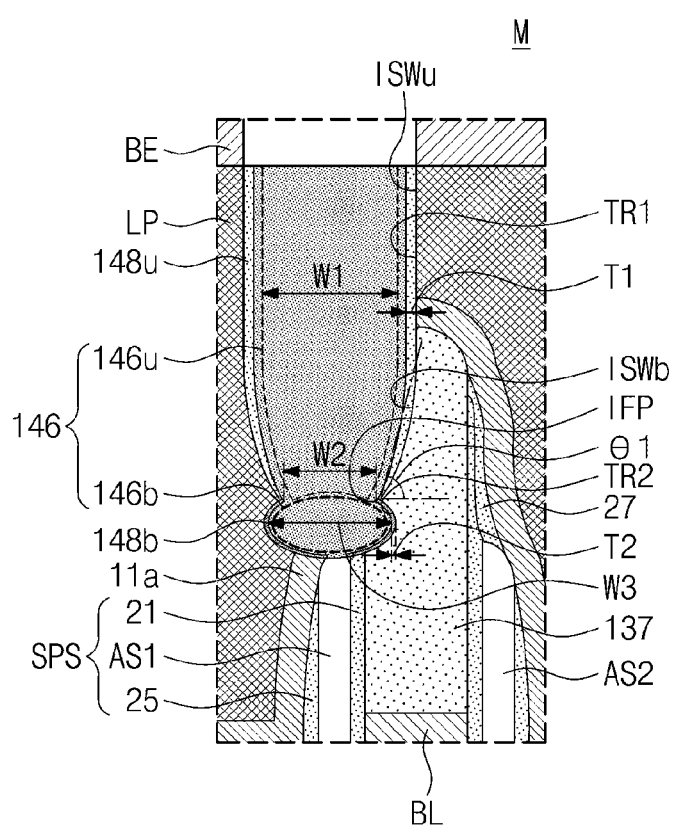
FIG. 27 is an enlarged sectional view illustrating a portion 'M' of FIG. 26.

FIG. 25 is a plan view illustrating a semiconductor memory device according to an embodiment of the inventive concept. FIG. 26 is a sectional view illustrating sections taken along lines A-A', B-B', and C-C' of FIG. 25. FIG. 27 is an enlarged sectional view illustrating a portion 'M' of FIG. 26. In the following description of FIGS. 25-27, an element previously described with reference to FIGS. 1 to 3 may be identified by the same reference number without repeating an overlapping description thereof, for concise description.

Referring to FIGS. 25 and 26, the spacer structure SPS may include the first spacer 21, an air gap region AS, and the third spacer 25. The air gap region AS may be interposed between the first spacer 21 and the third spacer 25. The air gap region AS may be an empty space filled with air. The air gap region AS may include a first air gap region AS1, which is vertically overlapped by the insulating pattern 146, and a second air gap region AS2, which is horizontally offset from (i.e., not vertically overlapped by) the insulating pattern 146.

Since the air gap region AS, which is filled with air having a low dielectric constant, is provided, it may be possible to reduce a parasitic capacitance between the landing pad LP and the bit line BL, which are adjacent to each other. As a result, it may be possible to improve electrical characteristics of the semiconductor memory device.

Now, the air gap region AS, the insulating pattern 146, and the liner 148 will be described in more detail with reference to FIG. 27. A top end of the second air gap region AS2 may be defined by the upper spacer 27. A top end of the first air gap region AS1 may be defined by (e.g., adjacent/bordered by) the lower insulating portion 146b. A portion of the lower insulating portion 146b may face the first air gap region AS1. In other words, the bottom surface of the lower insulating portion 146b may include a portion that is not covered by the lower liner 148b and is exposed to the first air gap region AS1.

Figure 28:
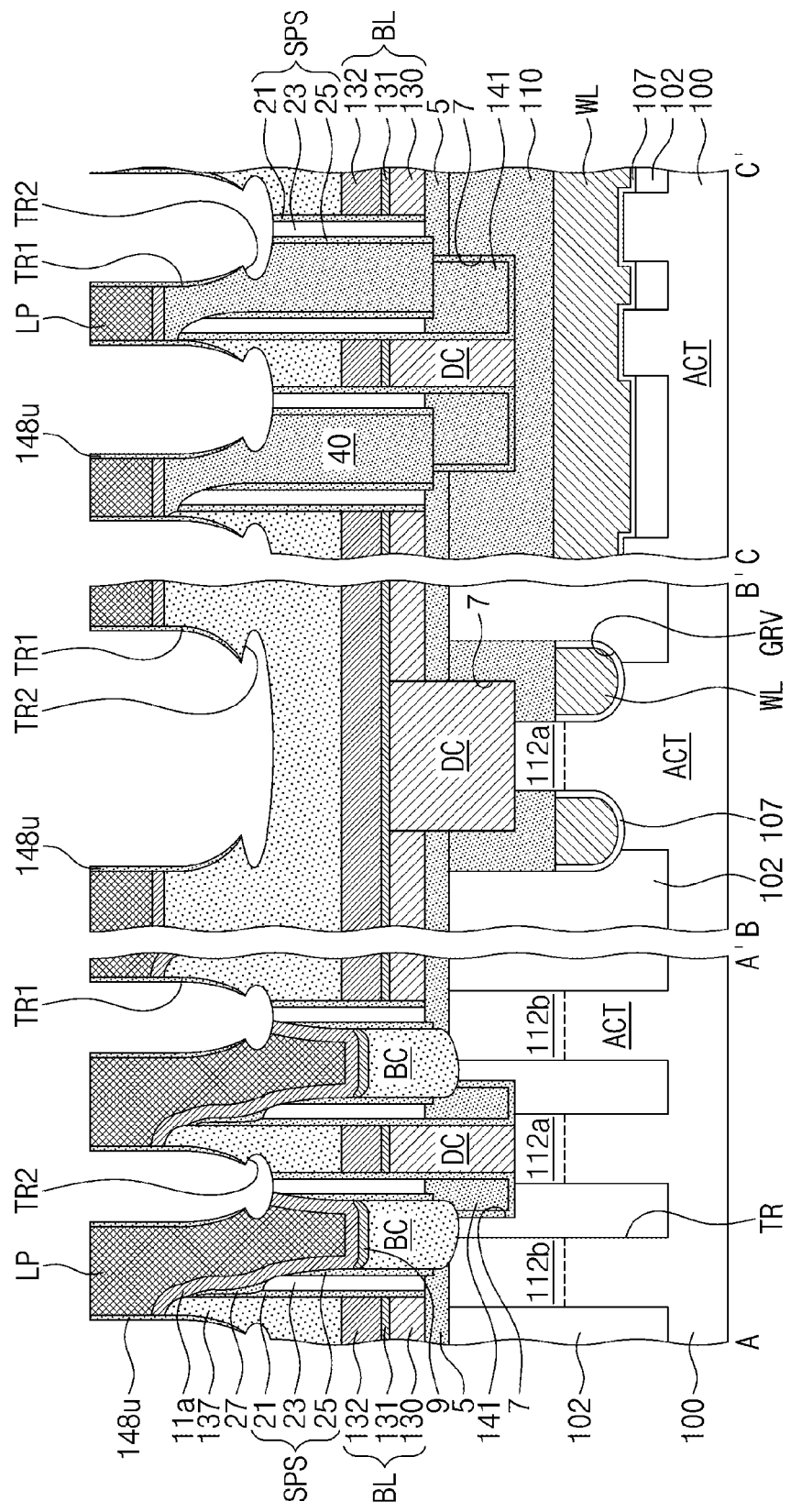
FIGS. 28 and 29 are sectional views illustrating a method of fabricating a semiconductor memory device according to an embodiment of the inventive concept and illustrating sections taken along lines A-A', B-B', and C-C' of FIG. 25.
Figure 29:
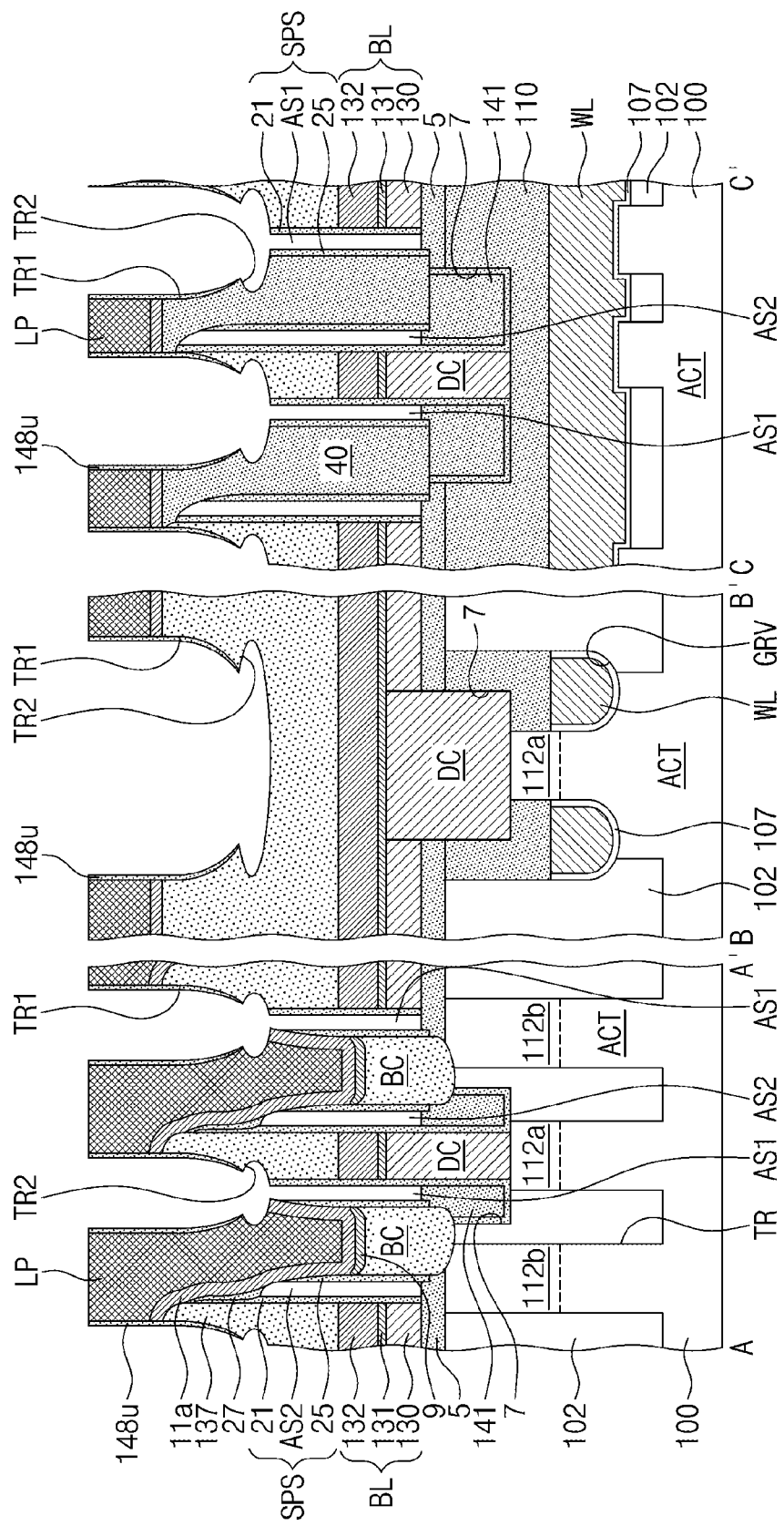

FIGS. 28 and 29 are sectional views illustrating a method of fabricating a semiconductor memory device according to an embodiment of the inventive concept and illustrating sections taken along lines A-A', B-B', and C-C' of FIG. 25.

Referring to FIGS. 25 and 28, the second trench TR2 may be formed below the first trench TR1 by the process described with reference to FIG. 22C. The second trench TR2 may be formed to expose a top surface of the second spacer 23.

Referring to FIGS. 25 and 29, the second spacer 23 may be selectively removed. The second spacer 23 may be formed of or include a material having an etch selectivity with respect to the first spacer 21 and the third spacer 25. For example, the second spacer 23 may be formed of or include at least one of various oxide materials (e.g., silicon oxide). In this case, the second spacer 23 may be selectively removed, as described above. The removal of the second spacer 23 may be performed by diffusing an etchant, which is chosen to selectively remove the second spacer 23. As a result, the air gap region AS may be formed in place of the second spacer 23.

Referring back to FIGS. 25 to 27, the lower liner 148b may be formed in the second trench TR2. The lower liner 148b may be formed by a deposition process using a nitrogen-containing precursor and/or plasma. In detail, the lower liner 148b may be formed by a chemical reaction between the nitrogen precursor with tungsten atoms, which are included in the landing pad LP exposed by the second trench TR2, or with silicon atoms, which are included in the spacer structure SPS and the bit line capping pattern 137 exposed by the second trench TR2. Alternatively, the lower liner 148b may be formed by an atomic layer deposition process.

Here, the upper liner 148u may also react with the nitrogen precursor, and in this case, the upper liner 148u may be thickened to have a thickness that is larger than or close to that of the upper liner 148u of FIG. 29. The largest thickness of the upper liner 148u may be larger than the largest thickness of the lower liner 148b. The lower liner 148b may be partly formed in or near the entrance of the first air gap region AS1, and in this case, the entrance of the first air gap region AS1 may have a reduced width.

Referring back to FIGS. 1 to 3, the insulating pattern 146 may be formed in (e.g., to fill) a remaining portion of the first and second trenches TR1 and TR2. The insulating pattern 146 may include the upper insulating portion 146u, which is formed in (e.g., to fill) the first trench TR1, and the lower insulating portion 146b, which is formed in (e.g., to fill) the second trench TR2. A portion of the lower insulating portion 146b may be in (e.g., may fill) the entrance of the first air gap region AS1, which is narrowed by the lower liner 148b. In other words, a top end of the first air gap region AS1 may be defined by (e.g., adjacent/bordered by) the lower insulating portion 146b. The data storage pattern BE may be formed on the landing pad LP.

According to an embodiment of the inventive concept, a second trench may be formed below a first trench, and here, the largest width of the second trench may be larger than the smallest width of the first trench. Accordingly, during a process of forming the second trench, a landing pad layer may be removed from a bottom surface of the first trench. This may make it possible to inhibit/prevent a short circuit from being formed between adjacent ones of landing pads by a residue of the landing pad layer.

In addition, an upper liner may be formed on an inner side surface of the first trench, and in this case, it may be possible to inhibit/prevent upper sidewalls of the landing pads from being etched during forming the second trench. Accordingly, it may be possible to inhibit/prevent the landing pad from having a reduced cross-sectional area and an increased electrical resistance. As a result, it may be possible to improve electrical characteristics of the semiconductor memory device.

While example embodiments of the inventive concept have been particularly shown and described, it will be understood by one of ordinary skill in the art that variations in form and detail may be made therein without departing from the scope of the attached claims.

What is claimed is:

1. A semiconductor memory device comprising:
 a substrate including an active pattern comprising a first source/drain region and a second source/drain region that are spaced apart from each other;
 a bit line that is electrically connected to the first source/drain region and crosses the active pattern;
 a storage node contact electrically connected to the second source/drain region;
 a spacer structure between the bit line and the storage node contact;
 a landing pad electrically connected to the storage node contact; an insulating pattern on the spacer structure and adjacent to the landing pad; and
 a liner between the insulating pattern and the landing pad, wherein the insulating pattern comprises:

an upper insulating portion;
a lower insulating portion between the upper insulating portion and the spacer structure; and
an inflection point defined between the upper insulating portion and the lower insulating portion on both sides of the insulating pattern in a cross-sectional view, and
wherein the largest width of the lower insulating portion is larger than the smallest width of the upper insulating portion, wherein the liner comprises an upper liner and a lower liner, wherein the lower liner wraps around a side surface and a bottom surface of the lower insulating portion.

2. The semiconductor memory device of claim 1, wherein, as the lower insulating portion approaches the substrate, a width of the lower insulating portion increases to the largest width and then decreases.

3. The semiconductor memory device of claim 1,
wherein the upper insulating portion and the lower insulating portion are respective portions of a single object.

4. The semiconductor memory device of claim 1,
wherein the largest thickness of the upper liner is larger than the largest thickness of the lower liner.

5. The semiconductor memory device of claim 1,
wherein the largest thickness of the upper liner is substantially equal to the largest thickness of the lower liner.

6. The semiconductor memory device of claim 1, wherein the spacer structure comprises:
a first spacer adjacent to the storage node contact;
a second spacer adjacent to the bit line; and
a third spacer between the first spacer and the second spacer.

7. The semiconductor memory device of claim 1, wherein the spacer structure comprises:
a first spacer adjacent to the storage node contact;
a second spacer adjacent to the bit line; and
an air gap region between the first spacer and the second spacer.

8. The semiconductor memory device of claim 7, wherein the lower insulating portion is adjacent a top end of the air gap region.

9. The semiconductor memory device of claim 7, wherein the air gap region comprises a first air gap region that is vertically overlapped by the lower insulating portion, and a second air gap region that is not vertically overlapped by the lower insulating portion.

10. The semiconductor memory device of claim 1, wherein a center point of the largest width of the lower insulating portion is offset from a center point of the smallest width of the upper insulating portion, in a first direction parallel to a top surface of the substrate.

11. A semiconductor memory device comprising:
a substrate including an active pattern;
a bit line crossing the active pattern;
a storage node contact adjacent to the bit line;
a spacer structure that is between the bit line and the storage node contact;
a first trench and a second trench on the spacer structure, the second trench being between the first trench and the spacer structure;
a landing pad electrically connected to the storage node contact;
an insulating pattern in the first trench and the second trench;
a liner enclosing the insulating pattern, wherein the liner comprises:
an upper liner in the first trench;
a lower liner in the second trench, the lower liner wrapping a side surface and a bottom surface of the insulating pattern; and
an inflection point defined between the upper liner and the lower liner on both sides of the liner in a cross-sectional view, and
wherein the largest thickness of the upper liner is larger than the largest thickness of the lower liner.

12. The semiconductor memory device of claim 11, wherein the insulating pattern comprises,
an upper insulating portion in the first trench; and
a lower insulating portion in the second trench,
wherein the largest width of the lower insulating portion is larger than the smallest width of the upper insulating portion.

13. The semiconductor memory device of claim 12, wherein the spacer structure comprises:
a first spacer adjacent to the storage node contact;
a second spacer adjacent to the bit line; and
an air gap region between the first spacer and the second spacer,
wherein the lower insulating portion is adjacent a top end of the air gap region.

14. The semiconductor memory device of claim 12, wherein the largest width of the upper insulating portion is larger than the largest width of the lower insulating portion.

15. The semiconductor memory device of claim 11, wherein the spacer structure comprises:
a first spacer adjacent to the storage node contact;
a second spacer adjacent to the bit line; and
a third spacer between the first spacer and the second spacer,
wherein the lower liner is in contact with the third spacer.

16. A semiconductor memory device comprising:
a substrate including an active pattern comprising a first source/drain region and a pair of second source/drain regions, wherein the second source/drain regions are spaced apart from each other and have the first source/drain region therebetween;
a device isolation layer on the substrate in a trench defining the active pattern;
a word line extending in a first direction across the active pattern;
a gate dielectric layer between the word line and the active pattern;
a word line capping pattern on the word line;
an interlayer insulating pattern on the word line capping pattern,
a bit line that is electrically connected to the first source/drain region, is on the interlayer insulating pattern, and extends in a second direction crossing the first direction, the bit line comprising a bit line polysilicon pattern, a bit line diffusion prevention pattern, and a bit line metal pattern that are sequentially stacked;
a spacer structure on a side surface of the bit line;
a storage node contact that is coupled to one of the second source/drain regions and is spaced apart from the bit line by the spacer structure;
a landing pad electrically connected to the storage node contact;
an insulating pattern on the spacer structure and adjacent to the landing pad;
a liner between the insulating pattern and the landing pad; and
a data storage pattern on the landing pad, wherein the insulating pattern comprises:
  an upper insulating portion;
  a lower insulating portion between the upper insulating portion and the spacer structure; and
  an inflection point defined between the upper insulating portion and the lower insulating portion on both sides of the insulating pattern in a cross-sectional view, and
  wherein the largest width of the lower insulating portion is larger than the smallest width of the upper insulating portion, wherein the liner comprises an upper liner and a lower liner, wherein the lower liner wraps around a side surface and a bottom surface of the lower insulating portion.

17. The semiconductor memory device of claim 16, wherein the semiconductor memory device further comprises another storage node contact that is coupled to another one of the second source/drain regions.

18. The semiconductor memory device of claim 16, wherein the largest thickness of the upper liner is larger than the largest thickness of the lower liner.

19. The semiconductor memory device of claim 16, wherein the spacer structure comprises,
  a first spacer adjacent to the storage node contact;
  a second spacer adjacent to the bit line; and
  a third spacer between the first spacer and the second spacer,
  wherein the liner is in contact with the third spacer.

20. The semiconductor memory device of claim 16, wherein the liner comprises at least one of silicon nitride or silicon oxide.

* * * * *